US010999940B2

(12) United States Patent
Kludt et al.

(10) Patent No.: US 10,999,940 B2
(45) Date of Patent: *May 4, 2021

(54) ELECTRONIC DISPLAY MOUNTING SYSTEM

(71) Applicant: Daktronics, Inc., Brookings, SD (US)

(72) Inventors: Kory D. Kludt, Sioux Falls, SD (US); Russell Jon Neyens, Brookings, SD (US); Jon M. Mammenga, Sioux Falls, SD (US)

(73) Assignee: Daktronics, Inc., Brookings, SD (US)

( * ) Notice: Subject to any disclaimer, the term of this patent is extended or adjusted under 35 U.S.C. 154(b) by 17 days.

This patent is subject to a terminal disclaimer.

(21) Appl. No.: 16/235,418

(22) Filed: Dec. 28, 2018

(65) Prior Publication Data

US 2019/0159348 A1    May 23, 2019

Related U.S. Application Data

(60) Continuation of application No. 15/292,843, filed on Oct. 13, 2016, now Pat. No. 10,201,100, which is a
(Continued)

(51) Int. Cl.
*H05K 5/00* (2006.01)
*F16B 7/04* (2006.01)
(Continued)

(52) U.S. Cl.
CPC ............ *H05K 5/0017* (2013.01); *F16B 2/12* (2013.01); *F16B 7/0473* (2013.01);
(Continued)

(58) Field of Classification Search
None
See application file for complete search history.

(56) References Cited

U.S. PATENT DOCUMENTS

| 2,053,547 A | 9/1936 | Austin |
| 2,164,846 A | 7/1939 | Thompson |

(Continued)

FOREIGN PATENT DOCUMENTS

| EP | 1524640 A2 | 4/2005 |
| JP | 8140023 A2 | 5/1996 |

(Continued)

OTHER PUBLICATIONS

"U.S. Appl. No. 16/403,940, Non Final Office Action dated Sep. 19, 2019"; 8 pgs.
(Continued)

*Primary Examiner* — David R Dunn
*Assistant Examiner* — Christopher E Veraa
(74) *Attorney, Agent, or Firm* — Schwegman Lundberg & Woessner, P.A.

(57) ABSTRACT

An electronic sign having slotted frame cabinets whereby each slotted frame cabinet can conveniently be attached to one or more vertically or horizontally positioned adjacent slotted frame cabinets by using connecting components which are generally located around the periphery of one or more slotted frame cabinets. Connecting components, including splice bars, splice plates, and mounting clamps, are aligned in, positioned along and secured to backing bars which are co-located in backing bar slots in one or more of the slotted frame cabinets. Lift eyes can be variably located in one or more lift eye slots. The use of externally located connecting components, which do not extend through the cabinetry, minimize the entry of environmental elements into the interior of the electronic sign. Multiple slotted frame cabinets can be connected without the removal of LED display panels.

19 Claims, 24 Drawing Sheets

Related U.S. Application Data continuation of application No. 14/499,150, filed on Sep. 27, 2014, now abandoned, which is a continuation of application No. 12/896,000, filed on Oct. 1, 2010, now Pat. No. 8,844,180, which is a division of application No. 12/077,130, filed on Mar. 17, 2008, now Pat. No. 7,926,213.

(60) Provisional application No. 60/923,366, filed on Apr. 13, 2007.

(51) Int. Cl.
| | |
|---|---|
| *H04N 5/64* | (2006.01) |
| *G09F 9/302* | (2006.01) |
| *F16B 2/12* | (2006.01) |
| *H05K 5/02* | (2006.01) |
| *H05K 5/06* | (2006.01) |

(52) U.S. Cl.
CPC ............ *G09F 9/3026* (2013.01); *H04N 5/64* (2013.01); *H05K 5/0021* (2013.01); *H05K 5/0204* (2013.01); *H05K 5/06* (2013.01)

(56) References Cited

U.S. PATENT DOCUMENTS

| | | |
|---|---|---|
| 3,594,761 A | 7/1971 | Boesen |
| 3,778,915 A | 12/1973 | Freeman et al. |
| 3,870,389 A | 3/1975 | Killam |
| 4,234,914 A | 11/1980 | Boesen |
| 4,285,379 A | 8/1981 | Kowalski |
| 4,830,531 A | 5/1989 | Condit et al. |
| 4,936,565 A | 6/1990 | Fredrickson |
| 4,964,231 A | 10/1990 | De Maat et al. |
| 5,154,385 A | 10/1992 | Lindberg et al. |
| 5,172,504 A | 12/1992 | De Maat et al. |
| 5,246,194 A | 9/1993 | Garcia |
| 5,268,828 A | 12/1993 | Miura |
| 5,271,586 A | 12/1993 | Schmidt |
| 5,321,417 A | 6/1994 | Voelzke et al. |
| 5,372,341 A | 12/1994 | Witherbee et al. |
| 5,409,335 A | 4/1995 | Beck |
| 5,492,476 A | 2/1996 | Ball et al. |
| RE35,479 E | 3/1997 | Witherbee et al. |
| 5,647,152 A | 7/1997 | Miura |
| 5,692,855 A | 12/1997 | Burton |
| 5,715,619 A | 2/1998 | Polisois et al. |
| 5,794,372 A | 8/1998 | Grana |
| 5,832,646 A | 11/1998 | Albin et al. |
| 5,975,657 A | 11/1999 | Lacour |
| 6,050,659 A | 4/2000 | Lacour |
| 6,076,295 A | 6/2000 | Garfinkle |
| 6,154,945 A | 12/2000 | Voelzke |
| 6,161,262 A | 12/2000 | Pfister |
| 6,169,632 B1 | 1/2001 | Kurtenbach et al. |
| 6,290,426 B1 | 9/2001 | van Gijsel et al. |
| 6,314,669 B1 | 11/2001 | Tucker |
| 6,334,285 B1 | 1/2002 | Kirschner |
| 6,508,494 B1 | 1/2003 | Reuter et al. |
| 6,561,117 B1 | 5/2003 | Kell |
| 6,588,711 B2 | 7/2003 | Onishi |
| D482,403 S | 11/2003 | Rose |
| 6,658,776 B1 | 12/2003 | Pynenburg et al. |
| 6,677,918 B2 | 1/2004 | Yuhara et al. |
| 6,726,117 B2 | 4/2004 | Herb |
| 6,729,054 B1 | 5/2004 | VanderTuin |
| 6,741,222 B1 | 5/2004 | Tucker |
| 6,751,914 B2 | 6/2004 | Zeh et al. |
| 6,813,853 B1 | 11/2004 | Tucker |
| 7,091,933 B2 | 8/2006 | McClintock et al. |
| 7,180,252 B2 | 2/2007 | Lys et al. |
| 7,226,025 B2 | 6/2007 | Sato et al. |
| 7,249,624 B2 | 7/2007 | Zeh et al. |
| 7,373,747 B1 | 5/2008 | Wiemer et al. |
| 7,401,995 B2 | 7/2008 | Senakiewich, II |
| 7,510,156 B1 | 3/2009 | Yaeger |
| 7,537,188 B2 | 5/2009 | Root et al. |
| 7,594,787 B2 | 9/2009 | Womack et al. |
| 7,677,182 B2 | 3/2010 | Mueller et al. |
| 7,694,444 B2 | 4/2010 | Miller et al. |
| 7,926,213 B1 | 4/2011 | Kludt et al. |
| 8,702,048 B2 | 4/2014 | Kludt et al. |
| 8,844,180 B2 | 9/2014 | Kludt et al. |
| 8,899,544 B2 | 12/2014 | Meredith, Jr. |
| 8,984,818 B2 | 3/2015 | Mcpheeters et al. |
| 9,447,799 B2 | 9/2016 | Kludt |
| 9,879,821 B2 | 1/2018 | Kludt |
| 10,201,100 B2 | 2/2019 | Kludt et al. |
| 10,317,007 B2 | 6/2019 | Kludt et al. |
| 2003/0070368 A1 | 4/2003 | Shingleton |
| 2003/0182871 A1 | 10/2003 | Gresham et al. |
| 2003/0217495 A1 | 11/2003 | Nagamine et al. |
| 2004/0139638 A1 | 7/2004 | Liao |
| 2006/0226314 A1 | 10/2006 | Dube et al. |
| 2008/0060234 A1 | 3/2008 | Chou et al. |
| 2009/0230265 A1 | 9/2009 | Newman et al. |
| 2009/0289160 A1 | 11/2009 | Kludt et al. |
| 2010/0192505 A1 | 8/2010 | Schaefer et al. |
| 2011/0019348 A1 | 1/2011 | Kludt et al. |
| 2014/0042286 A1 | 2/2014 | Jaffari |
| 2014/0306080 A1 | 10/2014 | Kludt et al. |
| 2015/0016034 A1 | 1/2015 | Kludt et al. |
| 2016/0377222 A1 | 12/2016 | Kludt et al. |
| 2017/0034930 A1 | 2/2017 | Kludt et al. |
| 2018/0119874 A1 | 5/2018 | Kludt et al. |
| 2019/0360635 A1 | 11/2019 | Kludt et al. |

FOREIGN PATENT DOCUMENTS

| | | |
|---|---|---|
| JP | 11265153 A2 | 9/1999 |
| JP | 2001350434 A2 | 12/2001 |

OTHER PUBLICATIONS

"U.S. Appl. No. 15/853,305, Preliminary Amendment filed Feb. 15, 2018", 8 pgs.

"U.S. Appl. No. 10/688,304, Non-Final Office Action dated Jul. 14, 2005", 5 pgs.

"U.S. Appl. No. 10/688,304, Notice of Allowance dated Jan. 17, 2006", 4 pgs.

"U.S. Appl. No. 10/688,304, Response filed Feb. 28, 2005 to Office Action dated Feb. 18, 2005", 15 pgs.

"U.S. Appl. No. 10/688,304, Response filed Oct. 14, 2005 to Office Action dated Jul. 14, 2005", 14 pgs.

"U.S. Appl. No. 10/688,304, Restriction Requirement dated Feb. 18, 2005", 5 pgs.

"U.S. Appl. No. 11/809,107, Final Office Action dated May 21, 2009", 7 pgs.

"U.S. Appl. No. 11/809,107, Non-Final Office Action dated Nov. 12, 2008", 6 pgs.

"U.S. Appl. No. 11/809,107, Notice of Allowance dated Nov. 27, 2009", 6 pgs.

"U.S. Appl. No. 11/809,107, Response filed Feb. 12, 2009 to Non-Final Office Action dated Nov. 12, 2008", 10 pgs.

"U.S. Appl. No. 11/809,107, Response filed Aug. 21, 2009 to Final Office Action dated May 21, 2009", 12 pgs.

"U.S. Appl. No. 12/077,130 Non Final Office Action dated Dec. 24, 2009", 6 pgs.

"U.S. Appl. No. 12/077,130 Response filed Jun. 23, 2010 to Non Final Office Action dated Dec. 24, 2009", 9 pgs.

"U.S. Appl. No. 12/077,130, Notice of Allowance dated Dec. 13, 2010", 6 pgs.

"U.S. Appl. No. 12/077,130, Office Action dated Aug. 27, 2010", 6 pgs.

"U.S. Appl. No. 12/077,130, Response filed Sep. 27, 2010 to Notice of Non-Compliant Amendment dated Aug. 27, 2010", 10 pgs.

"U.S. Appl. No. 12/471,233 , Response filed Mar. 8, 2012 to Non Final Office Action dated Nov. 3, 2011", 18 pgs.

(56) References Cited

OTHER PUBLICATIONS

"U.S. Appl. No. 12/471,233, Response filed Nov. 15, 2013 to Final Office Action dated Jul. 9, 2013", 16 pgs.
"U.S. Appl. No. 12/471,233, Examiner Interview Summary dated May 8, 2013", 3 pgs.
"U.S. Appl. No. 12/471,233, Final Office Action dated May 18, 2012", 13 pgs.
"U.S. Appl. No. 12/471,233, Final Office Action dated Jul. 9, 2013", 8 pgs.
"U.S. Appl. No. 12/471,233, Non Final Office Action dated Feb. 4, 2013", 10 pgs.
"U.S. Appl. No. 12/471,233, Non Final Office Action dated Nov. 3, 2011", 10 pgs.
"U.S. Appl. No. 12/471,233, Notice of Allowance dated Dec. 4, 2013", 10 pgs.
"U.S. Appl. No. 12/471,233, Preliminary Amendment filed Jul. 1, 2010", 9 pgs.
"U.S. Appl. No. 12/471,233, Response filed May 6, 2013 to Non Final Office Action dated Feb. 4, 2013", 16 pgs.
"U.S. Appl. No. 12/471,233, Response filed Sep. 26, 2012 to Final Office Action dated May 18, 2012", 15 pgs.
"U.S. Appl. No. 12/471,233, Response filed Sep. 12, 2011 to Restriction Requirement dated Aug. 17, 2011", 9 pgs.
"U.S. Appl. No. 12/471,233, Restriction Requirement dated Aug. 17, 2011", 8 pgs.
"U.S. Appl. No. 12/896,000, Response filed Nov. 1, 2011 to Non Final Office Action dated Oct. 7, 2011", 14 pgs.
"U.S. Appl. No. 12/896,000, Examiner Interview Summary dated Feb. 1, 2013", 3 pgs.
"U.S. Appl. No. 12/896,000, Final Office Action dated Feb. 13, 2012", 8 pgs.
"U.S. Appl. No. 12/896,000, Non Final Office Action dated Sep. 14, 2012", 8 pgs.
"U.S. Appl. No. 12/896,000, Non Final Office Action dated Oct. 7, 2011", 9 pgs.
"U.S. Appl. No. 12/896,000, Notice of Allowance dated May 27, 2014", 5 pgs.
"U.S. Appl. No. 12/896,000, Response filed Jan. 14, 2013 to Non final Office Action—dated Sep. 14, 2012", 14 pgs.
"U.S. Appl. No. 12/896,000, Response filed May 8, 2012 to Final Office Action dated Feb. 13, 2012", 12 pgs.
"U.S. Appl. No. 14/251,101, Advisory Action dated May 4, 2016", 5 pgs.
"U.S. Appl. No. 14/251,101, Examiner Interview Summary dated Jan. 29, 2016", 3 pgs.
"U.S. Appl. No. 14/251,101, Final Office Action dated Dec. 11, 2015", 12 pgs.
"U.S. Appl. No. 14/251,101, Non Final Office Action dated Mar. 17, 2015", 9 pgs.
"U.S. Appl. No. 14/251,101, Non Final Office Action dated Jun. 3, 2016", 6 pgs.
"U.S. Appl. No. 14/251,101, Notice of Allowance dated Aug. 10, 2016", 8 pgs.
"U.S. Appl. No. 14/251,101, Preliminary Amendment filed Sep. 15, 2014", 7 pgs.
"U.S. Appl. No. 14/251,101, Response filed Jan. 20, 2015 to Restriction Requirement dated Jan. 5, 2015", 8 pgs.
"U.S. Appl. No. 14/251,101, Response filed Mar. 11, 2016 to Final Office Action dated Dec. 11, 2015", 18 pgs.
"U.S. Appl. No. 14/251,101, Response filed Jul. 1, 2016 to Non Final Office Action dated Jun. 3, 2016", 9 pgs.
"U.S. Appl. No. 14/251,101, Response filed Sep. 16, 2015 to Non Final Office Action dated Mar. 17, 2015", 17 pgs.
"U.S. Appl. No. 14/251,101, Restriction Requirement dated Jan. 5, 2015", 6 pgs.
"U.S. Appl. No. 14/499,150, Non Final Office Action dated Apr. 13, 2016", 14 pgs.
"U.S. Appl. No. 14/499,150, Preliminary Amendment filed Sep. 29, 2014", 7 pgs.
"U.S. Appl. No. 15/261,482, Final Office Action dated May 1, 2017", 10 pgs.
"U.S. Appl. No. 15/261,482, Non Final Office Action dated Oct. 6, 2016", 8 pgs.
"U.S. Appl. No. 15/261,482, Notice of Allowance dated Sep. 22, 2017", 9 pgs.
"U.S. Appl. No. 15/261,482, Response filed Aug. 1, 2017 to Final Office Action dated May 1, 2017", 13 pgs.
"U.S. Appl. No. 15/261.482, Response filed Jan. 6, 2017 to Non Final Office Action dated Oct. 6, 2016", 8 pgs.
"U.S. Appl. No. 15/292,843, Final Office Action dated Aug. 7, 2017", 10 pgs.
"U.S. Appl. No. 15/292,843, Non Final Office Action dated Feb. 21, 2018", 7 pgs.
"U.S. Appl. No. 15/292,843, Notice of Allowance dated Sep. 26, 2018", 5 pgs.
"U.S. Appl. No. 15/292,843, Response filed Jun. 21, 2018 to Non Final Office Action dated Feb. 21, 2018", 7 pgs.
"U.S. Appl. No. 15/292,843, Response filed Nov. 7, 2017 to Final Office Action dated Aug. 7, 2017", 8 pgs.
"U.S. Appl. No. 15/853,305, Non Final Office Action dated Sep. 21, 2018", 7 pgs.
"U.S. Appl. No. 15/853,305, Respnse filed Nov. 28, 2018 to Non Final Office Action dated Sep. 21, 2018", 8 pgs.
"European Application Serial No. 08165444.4, European Search Report dated Mar. 4, 2009", 9 pgs.
"European Application Serial No. 08165444.4, Response filed Sep. 4, 2009", 27 pgs.
"Europeean Application Serial No. 04256340.3, European Search Report dated Nov. 6, 2006", 3 pgs.
"U.S. Appl. No. 15/853,305, Notice of Allowance dated Feb. 1, 2019", 8 pgs.

ELECTRONIC DISPLAY MOUNTING SYSTEM

CROSS REFERENCES TO RELATED APPLICATIONS

This application is a continuation of and claims the benefit of priority under 35 U.S.C. § 120 to U.S. patent application Ser. No. 15/292,843, filed on Oct. 13, 2016, which is a continuation of and claims the benefit of priority under 35 U.S.C. § 120 to U.S. patent application Ser. No. 14/499,150, filed on Sep. 27, 2014, which is a continuation of and claims the benefit of priority under 35 U.S.C. § 120 to U.S. patent application Ser. No. 12/896,000, filed on Oct. 1, 2010, which is a divisional of and claims the benefit of priority under 35 U.S.C. § 120 to U.S. patent application Ser. No. 12/077,130, filed on Mar. 17, 2008, which claims the benefit of priority under 35 U.S.C. § 119(e) to the earlier filed U.S. Provisional Application No. 60/923,366 filed Apr. 13, 2007, entitled "Cabinet Having Perimeter Track," the benefit of priority of each of which is claimed hereby, and each of which are incorporated into this application by reference as if fully set forth herein.

This patent application is related to patent application Ser. No. 11/809,107 filed on May 31, 2007, now issued as U.S. Pat. No. 7,694,444, entitled "Electronic Sign Having a Formed Metal Cabinet."

This application is also related to patent application Ser. No. 10/688,304 filed on Oct. 17, 2003, now issued as U.S. Pat. No. 7,055,271, entitled "Electronic Display Module Having a Four-Point Latching System for Incorporation into an Electronic Sign and Process."

BACKGROUND OF THE INVENTION

Field of the Invention

The present invention is for an electronic sign, and more particularly, for an electronic sign having slotted frame cabinets wherein each slotted frame cabinet conveniently attaches to one or more vertically or horizontally situated adjacent slotted frame cabinets. An individual slotted frame cabinet can also be utilized by itself for use as an electronic sign.

Description of the Prior Art

The invention is to be used as a replacement for current technology sign structures which are very labor intensive and which require welding, individual component fitting, drilling, and the like. Welding is very time consuming and is a hard process to control with respect to uniformity and trueness of surfaces. Welding also reduces the strength characteristics of aluminum structures used therein and thereabout. The new invention uses structural rivets for cabinet component attachment, thus eliminating the need for welding. Joining of components such as, but not limited to, formed channels to the slotted frames of the slotted frame cabinet is accomplished by the use of prepunched and preformed components and rivets. The use of structural prepunched and preformed components with rivets allows for the automation of the entire process of fabrication. The prepunched holes used for the accommodation of rivets self-align the component parts, thus substantially reducing manufacturing labor.

The new invention eliminates the need for nutserts and other traditional fastening schemes used for splicing and joining adjacent slotted frame cabinets and eliminates the need for attaching clip angle supports to the rear of an electronic sign cabinet. It does this by having substantially continuous slotted frame cabinets which can accept external splicing and connection structures such as mounting clamps, splice plates, backing bars, and the like, which can conveniently splice, align and secure adjacent slotted frame cabinets together in vertical or horizontal relationships.

Prior art devices relied on installing nutserts for splicing and attaching clip angles to the rear of a cabinet for mounting and/or installation purposes, each of which requires extra assembly steps and, when installed, do not have variable placement. The use of continuous horizontally aligned backing bar slots eliminates the requirement for the use of horizontal stringers on the rear of a sign structure which were used for mounting to various support structures.

Many prior art devices fail to accommodate unequally spaced vertically aligned ground mounted support structure. The invention provides a solution for such variable positioning of ground mounted support structure by providing slot mounted positionable mounting clamps aligned at variable spacings in slots along the entire horizontal length of one or more joined slotted frame cabinets to accommodate variably spaced ground based support structures such as, but not limited to, vertically aligned I-beam supports.

Prior art designs have been such that lift eyes penetrate the cabinet interior and are placed at predetermined points in the cabinet frame. The disadvantage of such a system is that it is labor intensive to attach the lift eyes. Furthermore, such through the cabinet structure mounting allows entry points for the elements. This present invention allows for flexibility in the lift eye location by allowing the lift eye to translate anywhere along a lift eye slot in the length of one or more of the cabinet sections. The lift structure does not communicate with the interior of the cabinet sections.

This invention also provides for a watertight assembly because the cabinet interior is not penetrated by the use of fasteners, such as used in prior art devices. The slotted frame cabinet interior is not penetrated during factory or on-site installation since cabinet sections are spliced externally by components which align to or within externally located slots located along and about the cabinet frame.

Prior art devices in the field required the removal of electronic display modules in order to splice cabinet sections, as splicing of one cabinet section to another required internal access to mounting hardware, connector plates, and the like. The present invention allows external connective splicing of vertically or horizontally adjacent cabinet sections without accessing the interior of a slotted frame cabinet.

SUMMARY OF THE INVENTION

The general purpose of the present invention is to provide an electronic sign having slotted frame cabinets. According to one or more embodiments of the present invention, there is provided an electronic sign comprised partly of slotted frame cabinets where the use of two or more slotted frame cabinets provides for a full complement of connective components, such as described herein. In the alternative, an individual slotted frame cabinet can be utilized to provide for a unitary electronic sign. Slotted frame cabinets which are central to the invention are constructed and joined together by using a plurality of similar profile geometrically configured components including a frame top, a frame bottom and frame ends, each of which has a plurality of external accessible slots extending along the length thereof.

A plurality of formed vertically aligned channels and formed mid-channels are secured between the frame top and the frame bottom of each slotted frame cabinet which serve, in part, as a mounting structure for a front mounted panel, the latter of which accommodates a plurality of electronic display modules. The preformed vertically aligned channels also serve, in part, as a mounting structure for rear panels. A shroud surrounds the perimeter of the joined slotted frame cabinets.

The slotted frame cabinets are joined by unique components and methods. Horizontally adjacent and aligned slotted frame cabinets are joined by the use of one or more geometrically configured splice bars in vertical orientation which align in and between opposed like slots in the frame ends of adjacent horizontally slotted frame cabinets and, in cooperation therewith, are also joined by splice plates secured to opposed vertically aligned backing bars in opposed like backing bar slots in the frame ends of the adjacent slotted frame cabinets. Installation of the splice plates provides for self-alignment of the frame ends of horizontally adjacent slotted frame cabinets.

Vertically adjacent and aligned slotted frame cabinets are joined by the use of one or more geometrically configured splice bars in a horizontal orientation which is or are aligned in and between opposed like slots in the frame top and frame bottom of vertically adjacent slotted frame cabinets and, in cooperation therewith, are also joined by mounting clamps serving, in part, like splice plates secured to opposed horizontally aligned backing bars. Installation of the mounting clamps provides for self-alignment of the frame tops and bottoms of vertically adjacent slotted frame cabinets. The mounting clamps are also used to secure joined combinations of slotted frame cabinets; i.e., the electronic sign having slotted frame cabinets, to ground mounted support structure. The mounting clamps are horizontally positionable along the sign in order to connect to unequally spaced support structure. A lift eye slot is also included along the frame top to slidingly accommodate one or more lift eyes.

One significant aspect and feature of the electronic sign having slotted frame cabinets of the present invention is the use of multiple slots along and about the perimeter to which a plurality of connection devices or other devices can be attached, captured and secured.

Still another significant aspect and feature of the present invention is the use of common geometry slotted frame components including a slotted frame top, a slotted frame bottom, and slotted frame ends which form connected inner panels where the slotted frame top and the slotted frame bottom serve as mounts for vertically aligned formed channels including formed mid-channels. The perimeter of the slotted frame components and the formed vertically aligned channels are not welded but are riveted in prepunched holes in order to automate the fabrication process and to improve reliability, manufacturability, tolerances, repeatability, and efficiency of assembly.

Another significant aspect and feature of the present invention is the use of adjacent perimeter splice bar slots in common with an interceding geometrically configured splice bar to align within and therebetween such slots to, in part, mutually secure the forward region of horizontally adjacent and aligned slotted frames ends or the forward region of vertically adjacent and aligned slotted frame tops and bottoms.

Another significant aspect and feature of the present invention is the use of backing bars residing in backing bar slots and used with splice plates to, in part, join the rearward portion of horizontally adjacent and aligned slotted frame cabinets.

Another significant aspect and feature of the present invention is the use of splice plates to align the fronts, rears and splice bar slots of the horizontally adjacent slotted frame cabinets.

Another significant aspect and feature of the present invention is the use of backing bars residing in backing bar slots and used with mounting clamps to join the rearward portion of vertically adjacent and aligned slotted frame cabinets.

Another significant aspect and feature of the present invention is the use of mounting clamps to align the fronts, rears and splice bar slots of the vertically adjacent slotted frame cabinets.

Another significant aspect and feature of the present invention is the use of backing bar mounting clamps and associated backing bar(s), the latter of which are horizontally positionable along backing bar slots along the horizontal length in order to align with variably spaced vertically aligned support structures, such as, but not limited to, I-beams.

Another significant aspect and feature of the present invention is that the lift eyes can be situated at an appropriate location in one or more lift eye slots along the length of the slotted frame top of one or more horizontally adjacent slotted frame cabinets to evenly distribute the weight during installation and during display.

Another significant aspect and feature of the present invention is that any connection points, splice plates, splice bars, mounting clamps, lift eyes, and the like are external to the slotted frame cabinet structure and, as such, there is no structural penetration by water and other unwanted fluid or debris.

Another significant aspect and feature of the present invention is the ability to join vertically or horizontally adjacent slotted frame cabinets without the removal of display modules.

Having thus briefly described one or more embodiments of the present invention and having mentioned some significant aspects and features of the present invention, it is the principal object of the present invention to provide an electronic sign having slotted frame cabinets.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
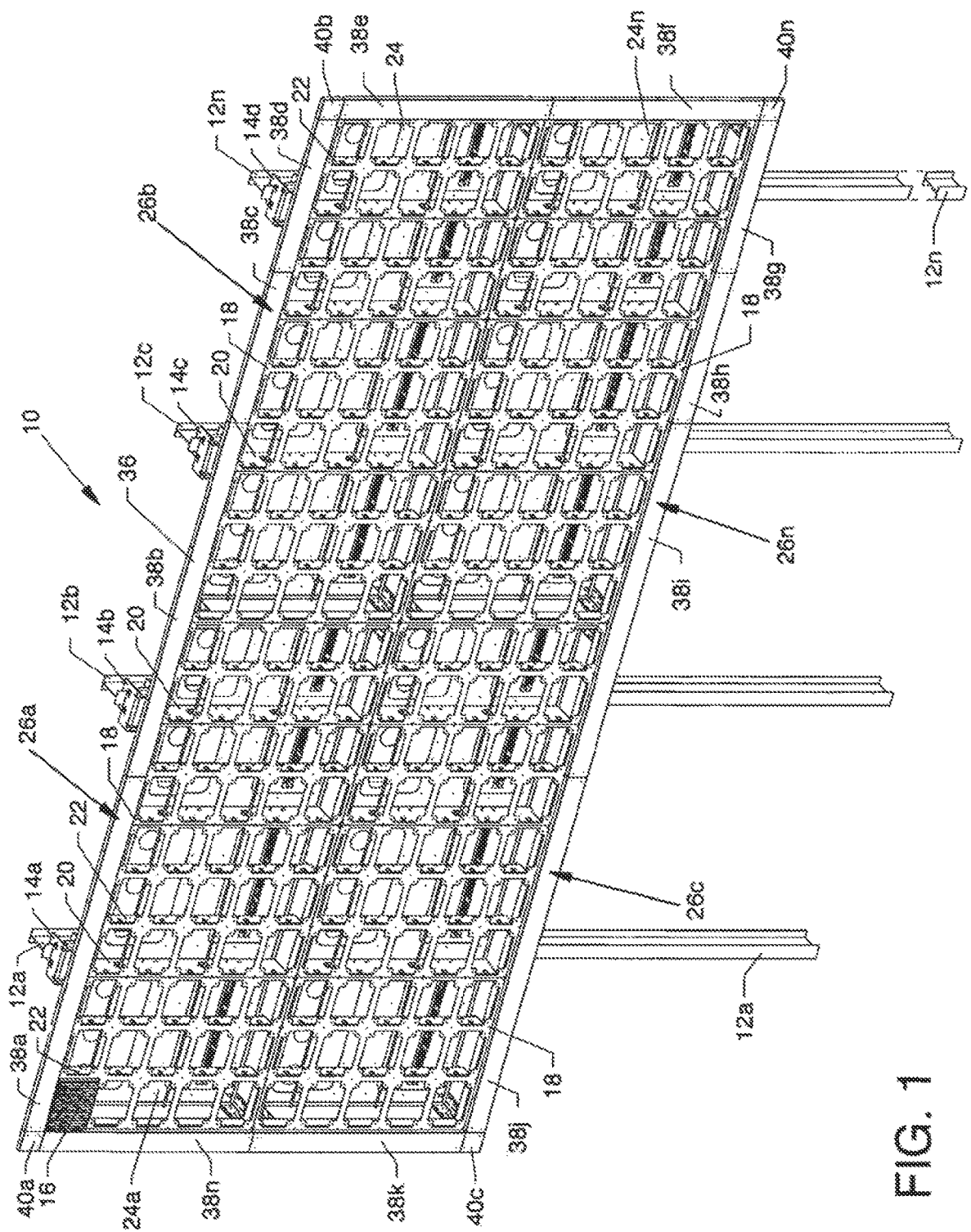
FIG. 1 is an isometric front view of an electronic sign having slotted frame cabinets, the present invention, mounted to a plurality of support structures.
Figure 2:
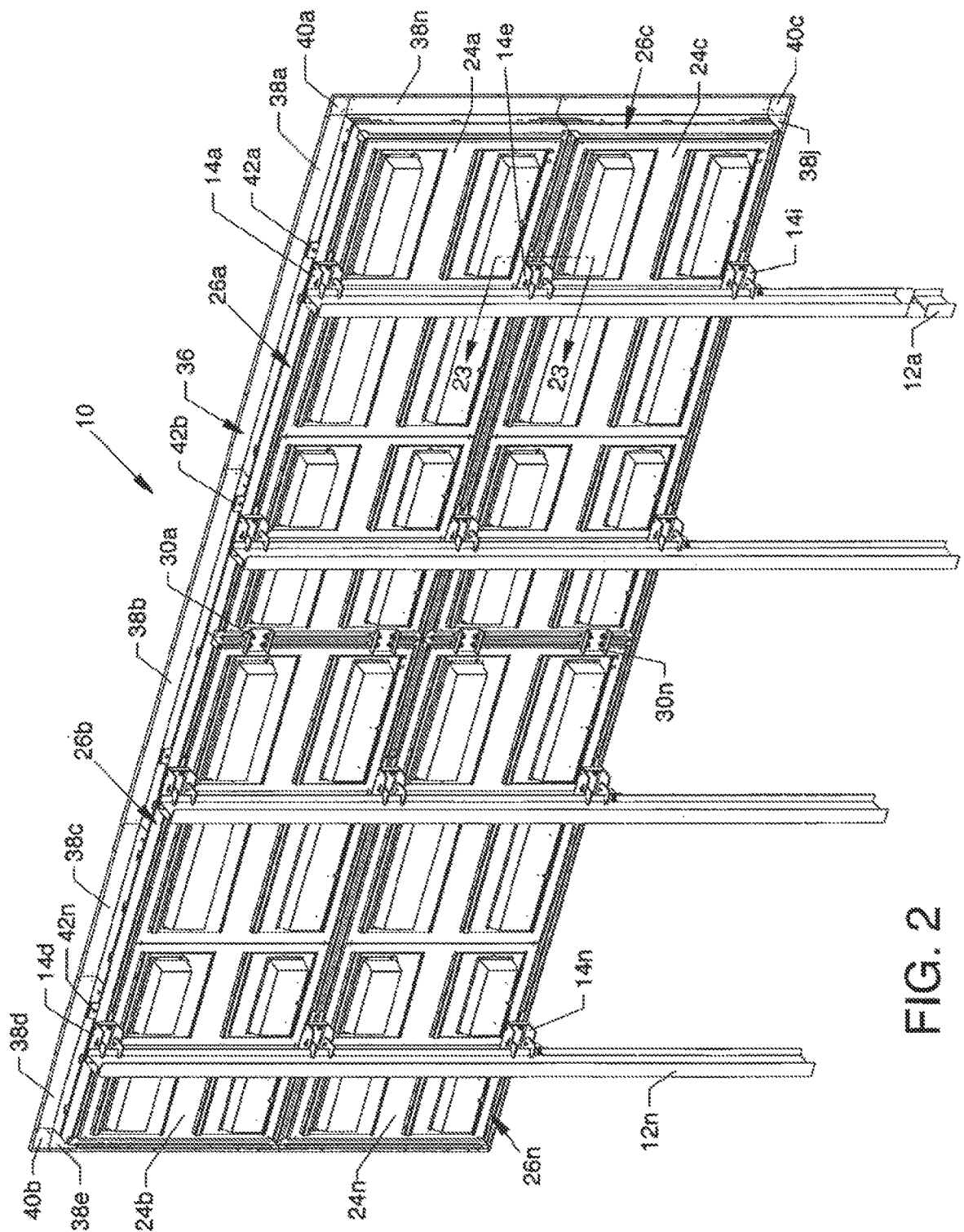
FIG. 2 is an isometric rear view of the electronic sign having slotted frame cabinets of FIG. 1 mounted to a plurality of support structures.

FIG. 1 is an isometric front view of an electronic sign having slotted frame cabinets 10, the present invention, mounted to a plurality of support structures 12a-12n by a plurality of like mounting clamps 14a-14n being part of and being located along and about the rear of the invention, as also shown in FIG. 2. One of a plurality of like electronic display modules 16 (also known as LED modules) having a four-point latching system populate the front of the present invention and are removably attached to a plurality of mounting panels 18 extending along and about the front of the invention. The structure and relationship of the mounting panels 18 and the electronic display modules 16 are described in U.S. Pat. No. 7,055,271 entitled "Electronic Display Module Having a Four-Point Latching System for Incorporation into an Electronic Sign and Process" and is incorporated herein in its entirety.

Also visible is a plurality of vertically aligned formed channels 20 of full width and a plurality of vertically aligned formed mid-channels 22 of reduced width secured along and about the invention, as later described in detail. The front surfaces of the formed channels 20 and the formed mid-channels 22 serve as a mount for the mounting panel 18 and the rear surfaces of the formed channels 20 serve as a mount for a plurality of rear vent panels 24a-24n, as also shown in FIG. 2.

Figure 3:
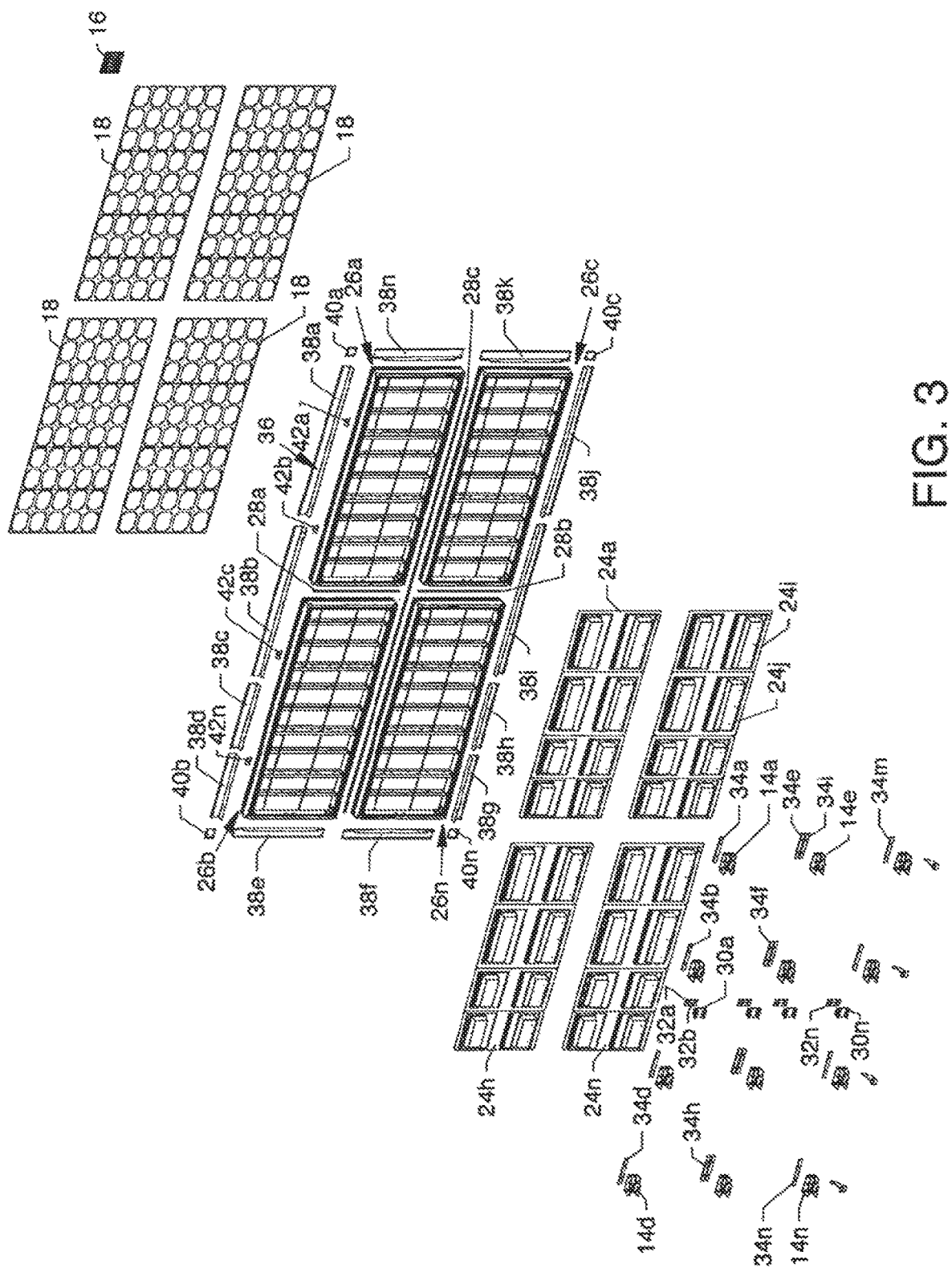
FIG. 3 is an exploded rear view of the invention components of FIG. 2.
Figure 4:
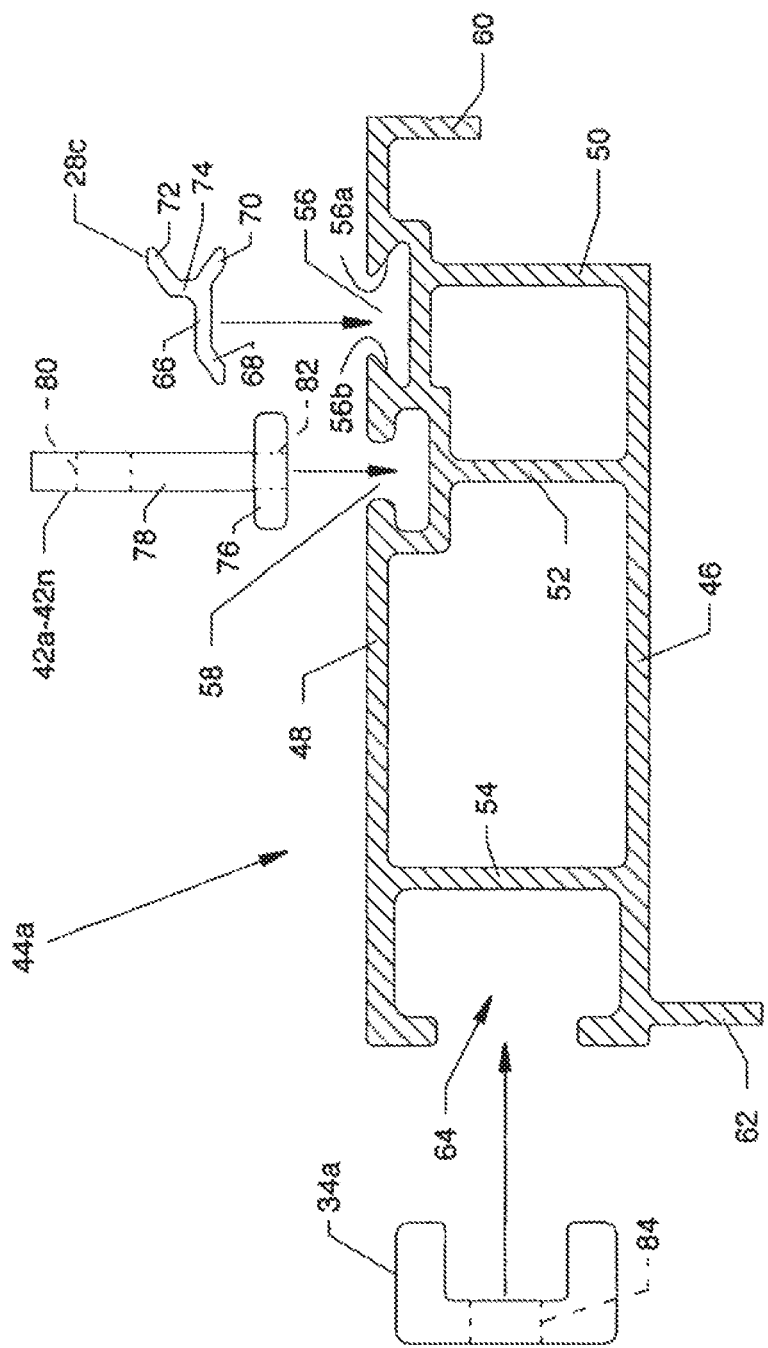
FIG. 4 is a cross section view of a horizontally oriented slotted frame top along line 4-4 of FIG. 5.

FIG. 2 is an isometric rear view of the electronic sign having slotted frame cabinets 10 of FIG. 1; and FIG. 3 is an exploded rear view of the invention components of FIG. 2. With reference to FIGS. 1, 2 and 3, the present invention is further described. Similarly constructed slotted frame cabinets 26 are central to the invention and can be designated as a plurality of slotted frame cabinets 26a-26n or, alternatively, as a slotted frame cabinet 26 as the construction is the same. The slotted frame cabinets 26a-26n can be arranged as shown in FIG. 3 and are connected by other components of the invention. One such connecting component is in the form of similarly shaped geometrically configured splice bars 28a, 28b and 28c, each having an elongated Y-shaped profile including similarly numbered features as shown in FIG. 4. Splice bars 28a and 28b are shown in vertical orientation and can be used, in part, to connect the adjacent frame ends of horizontally adjacent slotted frame cabinets 26a and 26b and, of course, the adjacent frame ends of horizontally adjacent slotted frame cabinets 26c and 26n, respectively, as later described in detail. Splice bar 28c, shown in horizontal orientation, can by itself, or if divided in halves, be used, in part, to connect the slotted frame bottom of cabinet 26a to the slotted frame top of the vertically adjacent cabinet 26c and, in part, to connect the slotted frame bottom of cabinet 26b to the slotted frame top of the vertically adjacent cabinet 26n, respectively, as later described in detail.

Other connection components are in the form of a plurality of splice plates 30a-30n in cooperation with a plurality of vertically oriented backing bars 32a-32n which, in part, are used to connect the adjacent frame ends of horizontally adjacent slotted frame cabinets 26a and 26b and, of course, the adjacent frame ends of horizontally adjacent slotted frame cabinets 26c and 26n. Other connection components are in the form of the plurality of mounting clamps 14a-14n used in cooperation with a plurality of horizontally oriented backing bars 34a-34n. Some of the mounting clamps 14a-14n and backing bars 34a-34n are used, in part, to connect vertically adjacent frame bottoms and frame tops of vertically adjacent slotted frame cabinet pair 26a-26c and pair 26b-26n. Some of the mounting clamps 14a-14n and backing bars 34a-34n are used to connect the frame tops of the slotted frame cabinets 26a and 26b to some of the support structures 12a-12n and some of the mounting clamps 14a-14n and backing bars 32a-32n are used to connect frame bottoms of the slotted frame cabinets 26c and 26n to some of the support structures 12a-12n. All of the mounting clamps 14a-14n and associated backing bars 34a-34n are used to connect the slotted frame cabinets 26a-26n to all of the support structures 12a-12n, respectively.

A multiple component shroud 36 surrounds the perimeter of the joined slotted frame cabinets 26a-26n. The shroud 36 is comprised of a plurality of elongated L-shaped shroud panels 38a-38n secured about the perimeter of the slotted frame cabinets 26a-26n and a plurality of shroud corners 40a-40n secured to some of the ends of the shroud panels 38a-38n. A plurality of positionable lift eyes 42a-42n are located along the top of the slotted frame cabinets 26a-26b, as described later in detail.

Each of the slotted frame cabinets 26a-26n uses a plurality of like structure slotted top, bottom and end components in the form of configured box tubes to form such slotted frame cabinets. FIG. 4 is a cross section view of a horizontally oriented slotted frame top 44a along line 4-4 of FIG. 5. A variety of panels and slots comprises the described cross section shown in FIG. 4. An inner panel 46 opposes an outer panel 48 which panels are mutually connected by a front panel 50, a mid-panel 52, and a back panel 54. The outer panel 48 includes an outwardly located splice bar slot 56 and an adjacent inwardly located lift eye slot 58. The splice bar slot 56 includes angled slot walls 56a and 56b. A forwardly located front mounting panel 60 extends perpendicularly from one end of the outer panel 48 and inwardly toward the center of the slotted frame cabinet 26. A rear mounting panel 62 extends perpendicularly from one end of the inner panel 46 and inwardly toward the center of the slotted frame cabinet 26. A rearwardly located backing bar slot 64 is located between the rear portions of the outer panel 48 and the inner panel 46. The cross section of a vertically oriented slotted frame end 44b, the cross section of a vertically oriented slotted frame end 44c, and the cross section of a vertically oriented slotted frame bottom 44d are substantially the same where each has a different orientation. All or some of the features described can be utilized for accommodating closely associated components, as described later in detail.

FIG. 4 also shows an end view of components which can be accommodated directly by the slots of the slotted frame top 44a. The same accommodating relationships also exist with the slotted frame end 44b, the slotted frame end 44c, and the slotted frame bottom 44c, as applicable. The splice bar 28c, which is shown in a horizontal orientation, has a plurality of panels extending at angles from a central panel 66, including opposed panels 68 and 70 extending from the central panel 66, and another panel 72 offset from the central panel 66 by a short panel 74. The opposed panels 68 and 70 of the splice bar 28c are aligned with and are mutually secured within the angled slot walls 56b and 56a, respectively, of the splice bar slot 56. Interaction of the splice bar 28c and other splice bars with splice bar slots 56 is described later in detail. Splice bars 28a and 28b have the same profile but are used in vertical orientation. An end view of the lift eyes 42a-42n, each having a horizontally orientated base panel 76, a connected vertically oriented panel 78, and a hole 80 extending through the panel 78, is also shown. The base panels 76 of each of the lift eyes 42a-42n are slidingly accommodated by the lift eye slot(s) 58 of the 20 slotted frame tops 44a. Threaded holes 82, one of which is shown, are included at opposing ends of the base panel 76 for the use of bolts (not shown) which can extend therethrough to contact the bottom of the lift eye slot 58 to provide a frictional engagement arrangement of the lift eyes 42a-42n in the lift eye slot 58. The backing bar 34a in the form of a channel is also shown which includes holes 84 extending therethrough. Backing bars 34a-34n are slidingly accommodated by backing bar slots 64 in each of the slotted frame tops 44a and slotted frame bottoms 44d. Backing bars 32a-32n, having the same cross section and shape as backing bars 34a-34n, are slidingly accommodated in some of the backing bars slots 64 of the slotted frame ends 44b and 44c.

Figure 5:
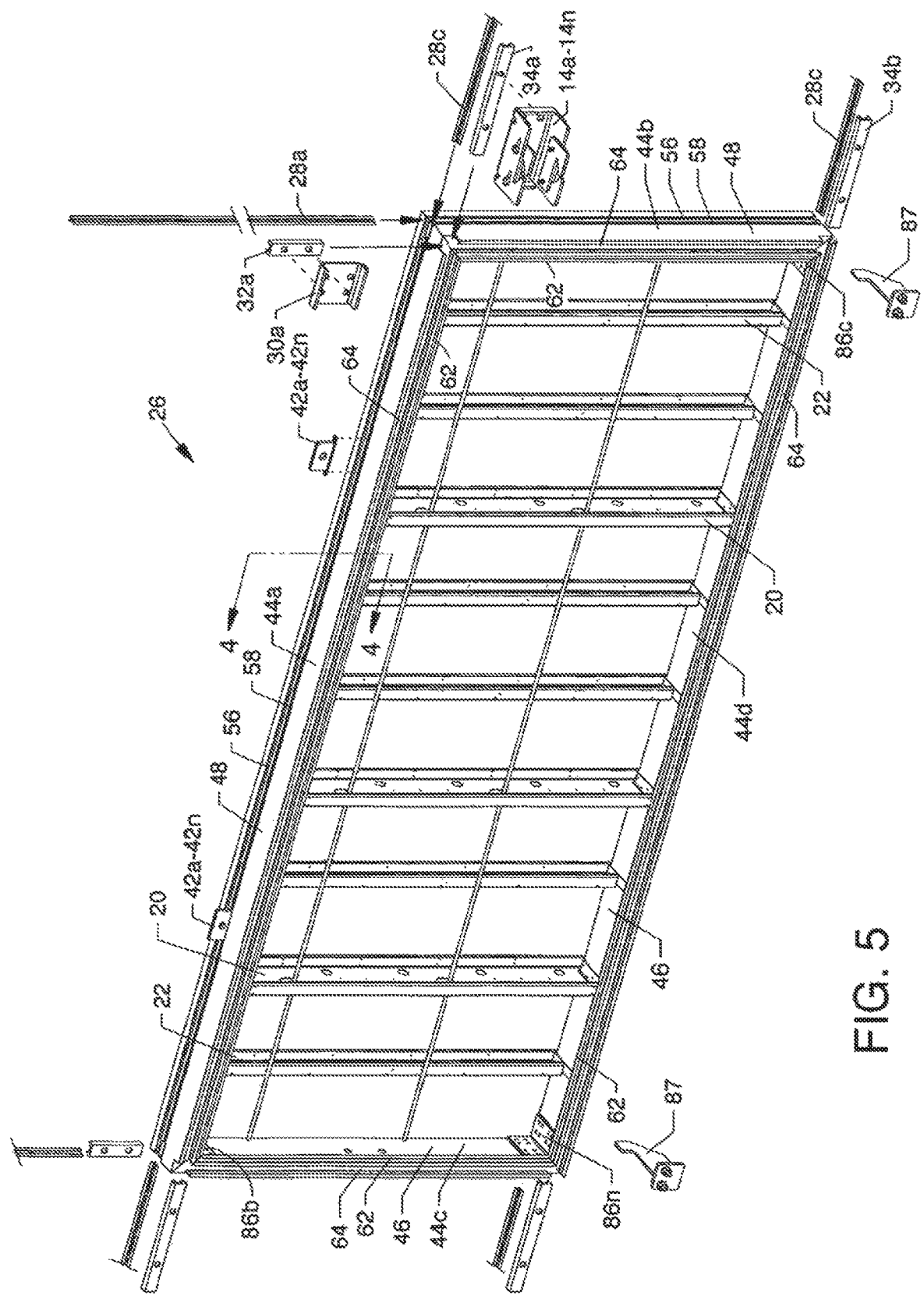
FIG. 5 is an isometric view of a single slotted frame cabinet and some associated components.

FIG. 5 is an isometric view of a single slotted frame cabinet 26 and some associated components which view represents anyone of the slotted frame cabinets 26a-26n. The ends of each of the slotted frame top 44a, the slotted frame ends 44b and 44c, and the slotted frame bottom 44d are miter cut and are suitably joined by right angle brackets 86a-86n connecting the inner panels 46. The inner panel 46 of the slotted frame top 44a and the opposed inner panel 46 of the slotted frame bottom 44d serve as mounts for the opposing ends of the preformed vertically oriented formed channels 20 and formed mid-channels 22, as described with reference to patent application Ser. No. 11/809,107 filed on May 31, 2007, entitled "Electronic Sign Having a Formed Metal Cabinet."

Preferably, the general relationship and uses of several previously described components to a slotted frame cabinet 26, but not necessarily to any of the specific slotted frame cabinets 26a-26n, is demonstrated with certain exceptions below. For example:

1. As previously described, the lift eyes 42a-42n can align in the lift eye slots 58 when the slotted frame cabinet 26 is used as the slotted top frame cabinet 26a or 26b.

2. The splice bar slot 56 in the slotted frame top 44a and the splice bar slot 56 in the slotted frame bottom 44d can accommodate a splice bar 28c. However, the preferred mode of assembly is the use of a splice bar 28c to join the slotted frame top 44a of the lower slotted frame cabinets, such as horizontally adjacent slotted frame cabinets 26c and 26n, to the slotted frame bottoms 44d of the upper slotted frame cabinets, such as horizontally adjacent slotted frame cabinets 26a and 26b.

3. The splice bar slot 56 in the slotted frame end 44b and the splice bar slot 56 in the slotted frame end 44c can accommodate splice bars 28a or 28b. However, the preferred mode of assembly is the use splice bars 28a and 28b to join the slotted frame end 44c of the slotted frame cabinets, such as vertically adjacent slotted frame cabinets 26a and 26c to the slotted frame ends 44b of the slotted frame cabinets, such as vertically adjacent slotted frame cabinets 26b and 26n.

4. The backing bar slots 64 in the slotted frame top 44a and the backing bar slots 64 in the slotted frame bottom 44d can accommodate backing bars 34a-34n.

5. The backing bar slots 64 in the slotted frame ends 44b and 44c can accommodate backing bars 32a-32n.

6. The splice plates 30a-30n utilize pairs of backing bars 32a-32n for attachment to some of the backing bar slots 64, as described later in detail.

7. Individual mounting clamps 14a-14n utilize one or more backing bars 34a-34n for attachment to some of the backing bar slots 64, as described later in detail.

Support brackets 87 which can be secured at appropriate locations along the support structures 12a-12n are also shown. The support brackets 87 can be used as a support during installation of the electronic sign having slotted frame cabinets on the support structures 12a-12n to provide either temporary or permanent support.

Figure 6:
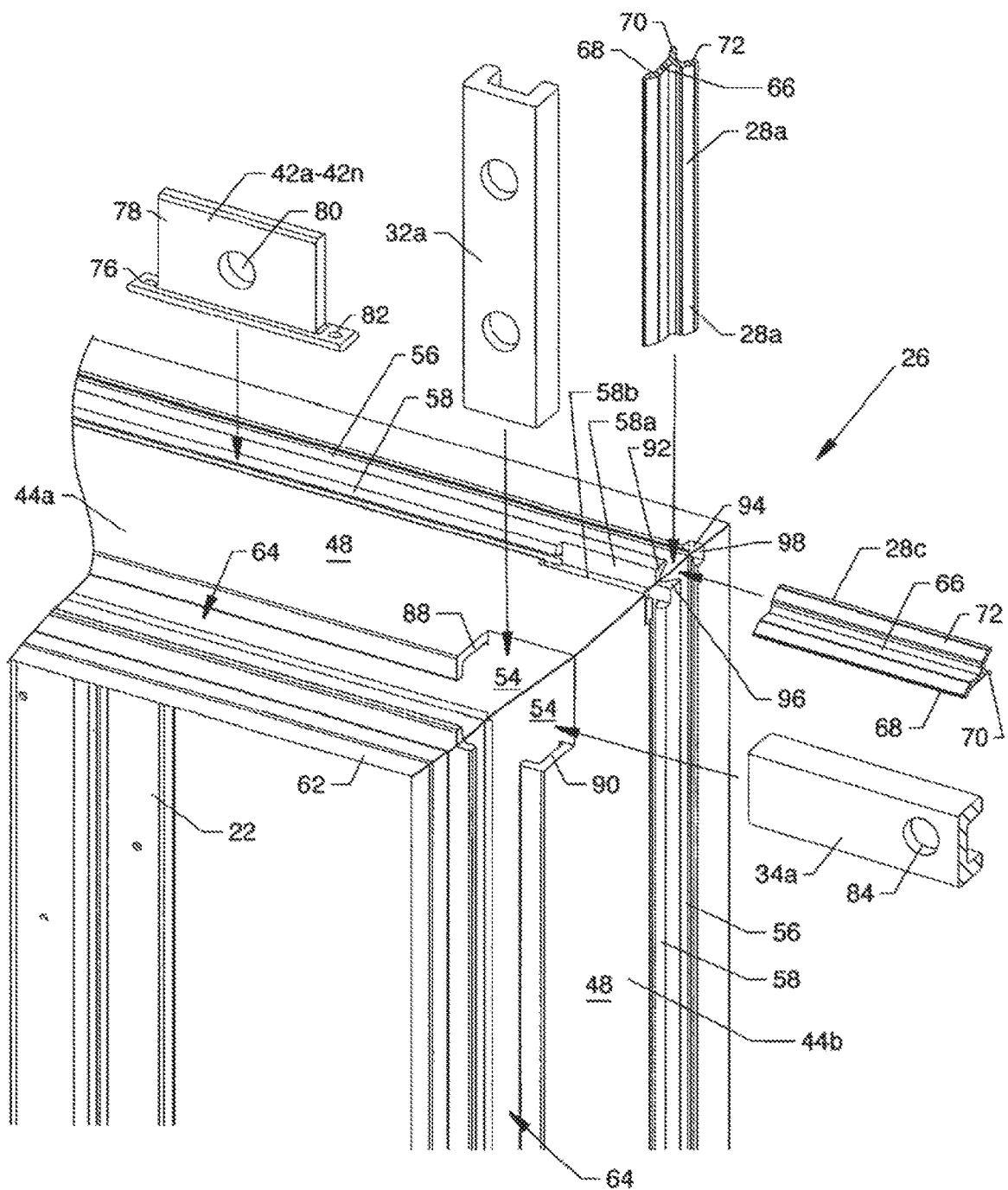
FIG. 6 is a rear view of a corner of the slotted frame cabinet of FIG. 5 showing the relationship of several splice bars, backing bars, and lift eyes thereto.

FIG. 6 is a rear view of a corner of the slotted frame cabinet 26 of FIG. 5 showing the relationship of several splice bars 28a, 28c, backing bar 34a, 32a, and lift eyes 42a-42n thereto. A cutout 88 is provided at the corner of the outer panel 48 in the slotted frame top 44a in order that the vertically oriented backing bar 32a can be inserted into the backing bar slot 64 of the slotted frame end 44b of the representative slotted frame cabinet 26. Another cutout similar to cutout 88 (not shown) is located at the opposite end of the outer panel 48 of the slotted frame top 44a for accommodating another of the vertically oriented backing bars 32a-32n. Cutouts similar to cutout 88 are not provided at the bottom ends of the slotted frame ends 46b and 46c in order that backing bars 32a-32n will not fall out of the backing bar slots 64 during assembly.

A cutout 90 is provided at the top corner of the outer panel 48 in the slotted frame end 44b and another cutout similar to 90 (not shown) is located at the bottom corner in the slotted frame end 44b in order that the horizontally oriented backing bars 34a-34n can be inserted into the backing bar slot 64 of the slotted frame top 44a of the representative slotted frame cabinet 26 and into the backing bar slot 64 of the slotted frame bottom 44d of the representative slotted frame cabinet 26. The slotted frame end 44c is a mirror image of the slotted frame end 44b and is constructed and used in the same fashion as the slotted frame bottom 44d.

Figure 7:
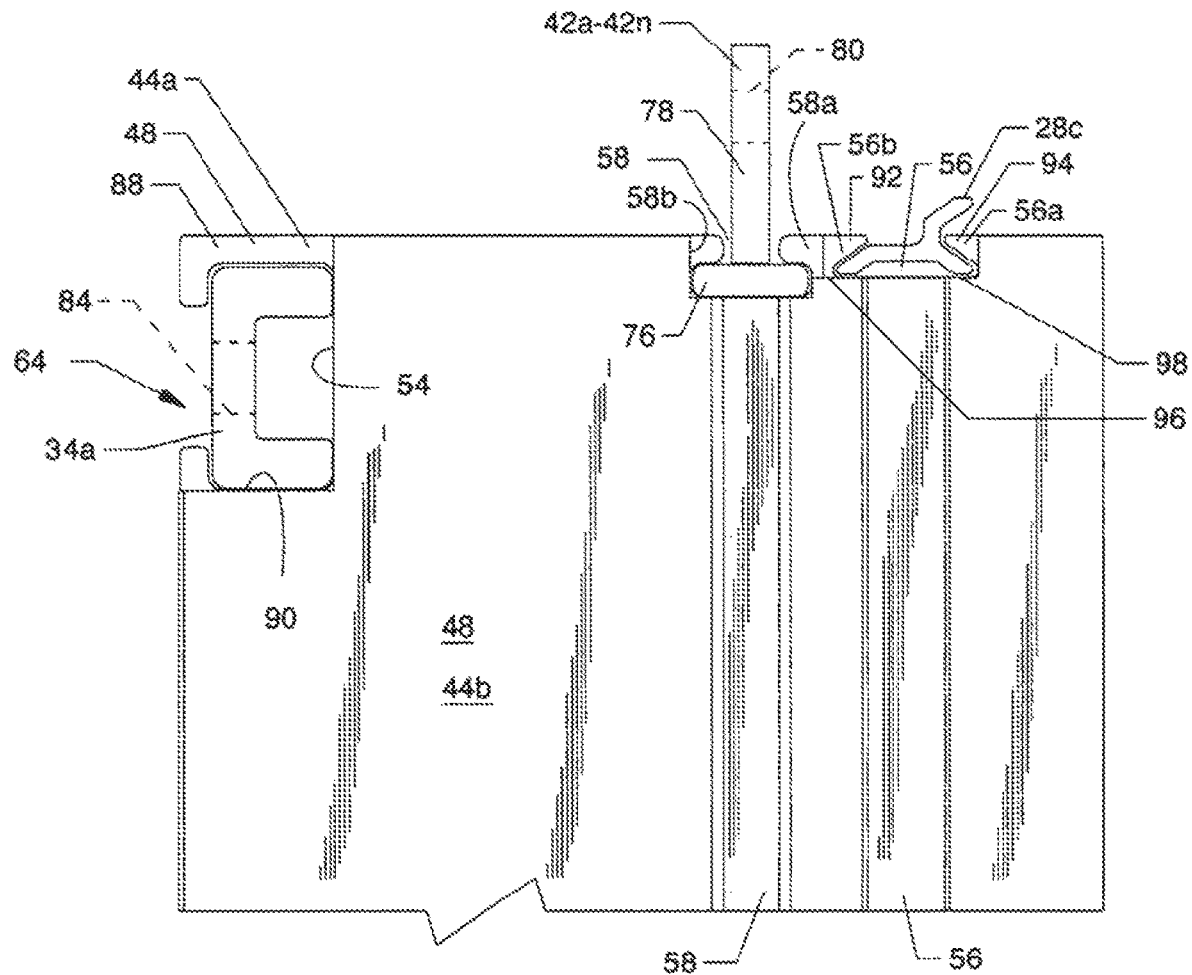
FIG. 7 is an end view of the top left corner of the slotted frame cabinet shown in FIG. 6 where horizontally aligned components are shown aligned within their respective slots.

Referring to FIGS. 6 and 7, cutouts 92 and 94 are shown at the end of the splice bar slot 56 of the slotted frame top 44a in order that the vertically oriented splice bar 28a can be inserted into the splice bar slot 56 of the slotted frame end 44b of the representative slotted frame cabinet 26. Similarly configured cutouts are located at the opposite end of the splice bar slot 56 of the slotted frame top 44a. Cutouts 96 and 98 are included at the top end of the splice bar slot 56 of the slotted frame end 44b (and cutouts similar to cutouts 96 and 98 are located at the top end of the splice bar slot 56 of the slotted frame end 44c) in order that horizontally oriented splice bars 28c can be inserted into the splice bar slot 56 of the slotted frame top 44a of the representative slotted frame cabinet 26. A widening of the lift eye slot 58 is shown at 58a and 58b (FIG. 7) for addition of lift eyes 42a-42n, as desired. Like and similar teachings, relationships, configurations, and components are included along and about the present invention as described or illustrated.

FIG. 7 is an end view of the top left corner of the slotted frame cabinet 26 shown in FIG. 6 where horizontally aligned components are shown aligned within their respective slots.

FIGS. 8-14 illustrate additional structure associated with the invention and the method of attachment of horizontally adjacent slotted frame cabinets, such as slotted frame cabinets 26a and 26b, using previously described structure and additional structure as described herein.

Figure 8:
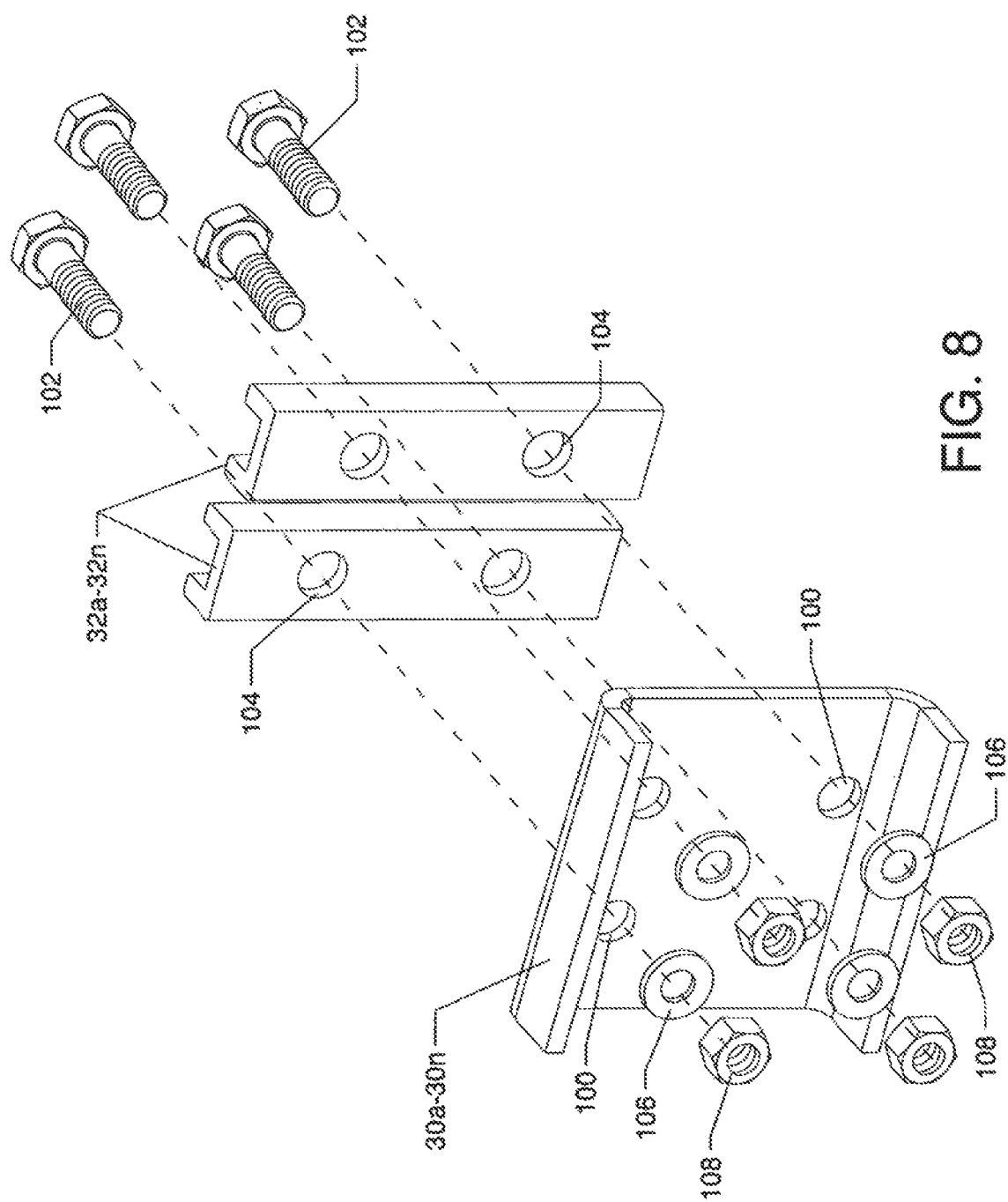
FIG. 8 is an exploded isometric rear view of a splice plate and two backing bars used with the splice plate and associated hardware.

FIG. 8 is an exploded isometric rear view of one of the splice plates 30a-30n and two of the backing bars 32a-32n used with the splice plates 30a-30n and associated hardware to, in part, secure horizontally adjacent slotted frame cabinets such as slotted frame cabinets 26a and 26b or horizontally adjacent slotted frame cabinets such as slotted frame cabinets 26c and 26n. The rear portion of the splice plates 30a-30n include a plurality of holes 100. Bolts 102 extend through holes 104 in the backing bars 32a-32n, through the opening of some backing bar slots 64, and through the holes 100 of the backing plates 30a-30n, as well as through washers 106 and into nuts 108, as indicated. The heads of the bolts 102 align closely and fixingly contact and secure between the walls of the backing bars 32a-32n.

Figure 9:
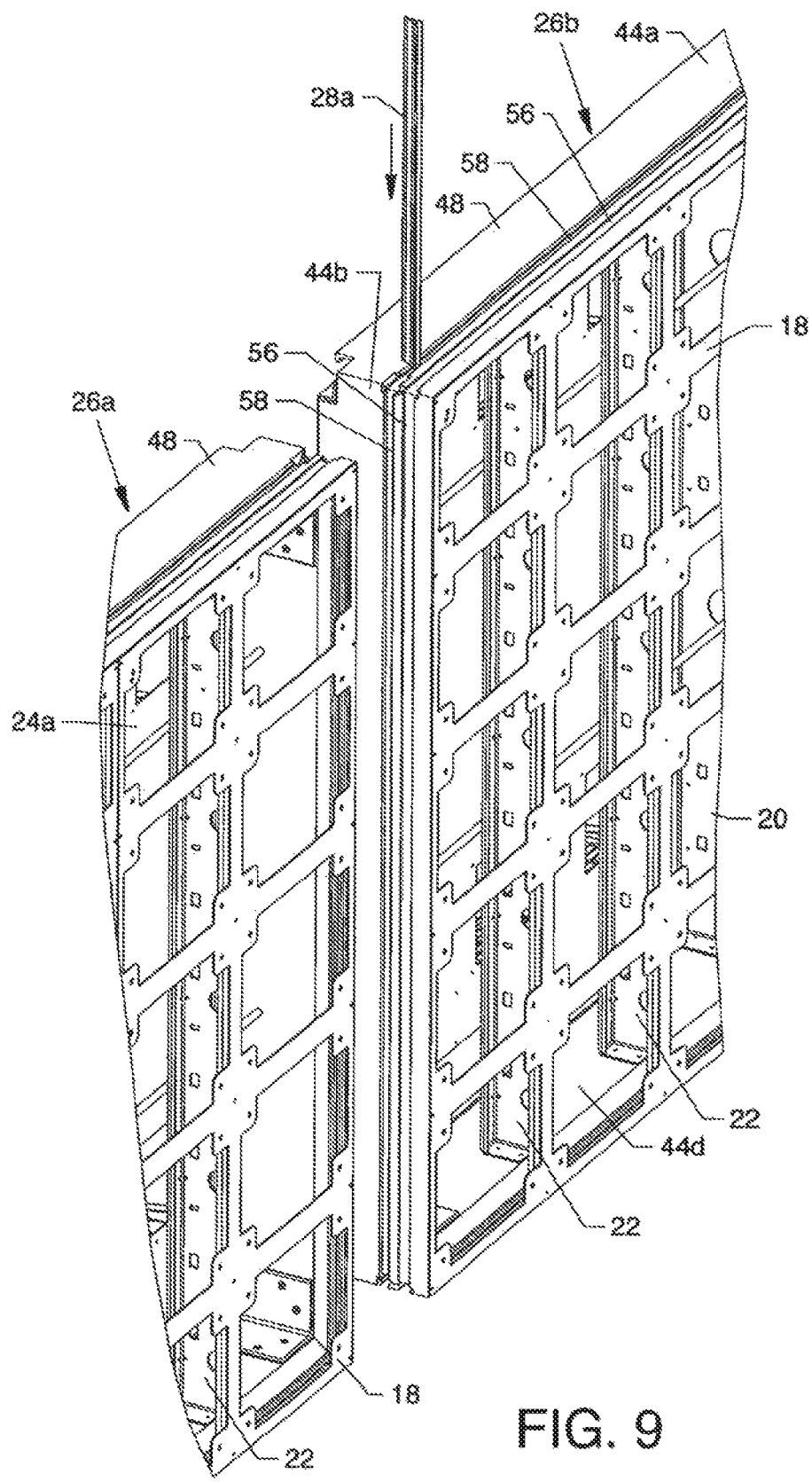
FIG. 9 shows an initial alignment of a slotted frame end of a slotted frame cabinet in close proximity to an adjacent slotted frame end of another slotted frame cabinet.
Figure 10:
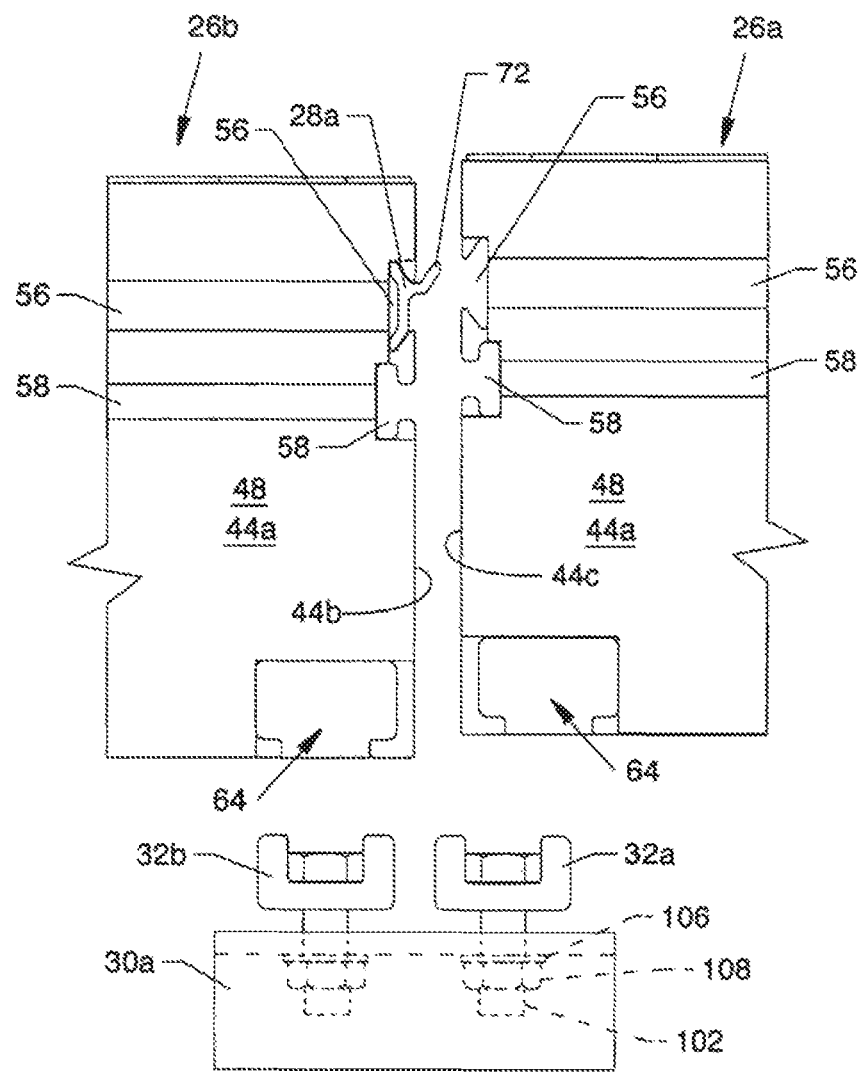
FIG. 10 is a top view showing a step where a vertically aligned splice bar is aligned in a splice bar slot in a slotted frame end of a slotted frame cabinet.

FIG. 9 shows the initial alignment of the slotted frame end 44b of the slotted frame cabinet 26b in close proximity to the slotted frame end 44c (not shown) of the slotted frame cabinet 26a. A vertically aligned splice bar 28a is shown distanced but aligned with the splice bar slot 56 of the slotted frame end 44b in the slotted frame cabinet 26b awaiting positioning therein. Preferably, the slotted frame cabinet 26b and the slotted frame cabinet 26a are offset from each other, as shown in FIG. 10. The display modules 16 are not shown for the purpose of brevity and clarity.

FIG. 10 is a top view showing a step where the vertically aligned splice bar 28a is aligned in the splice bar slot 56 in the slotted frame end 44b of the slotted frame cabinet 26b. The slotted frame cabinet 26b and the slotted frame cabinet 26a are offset from each other in order that the panel 72 of the vertically aligned splice bar 28a aligns with the opening of the splice bar slot 56 in the slotted frame end 44c of the slotted frame cabinet 26a.

Figure 11:
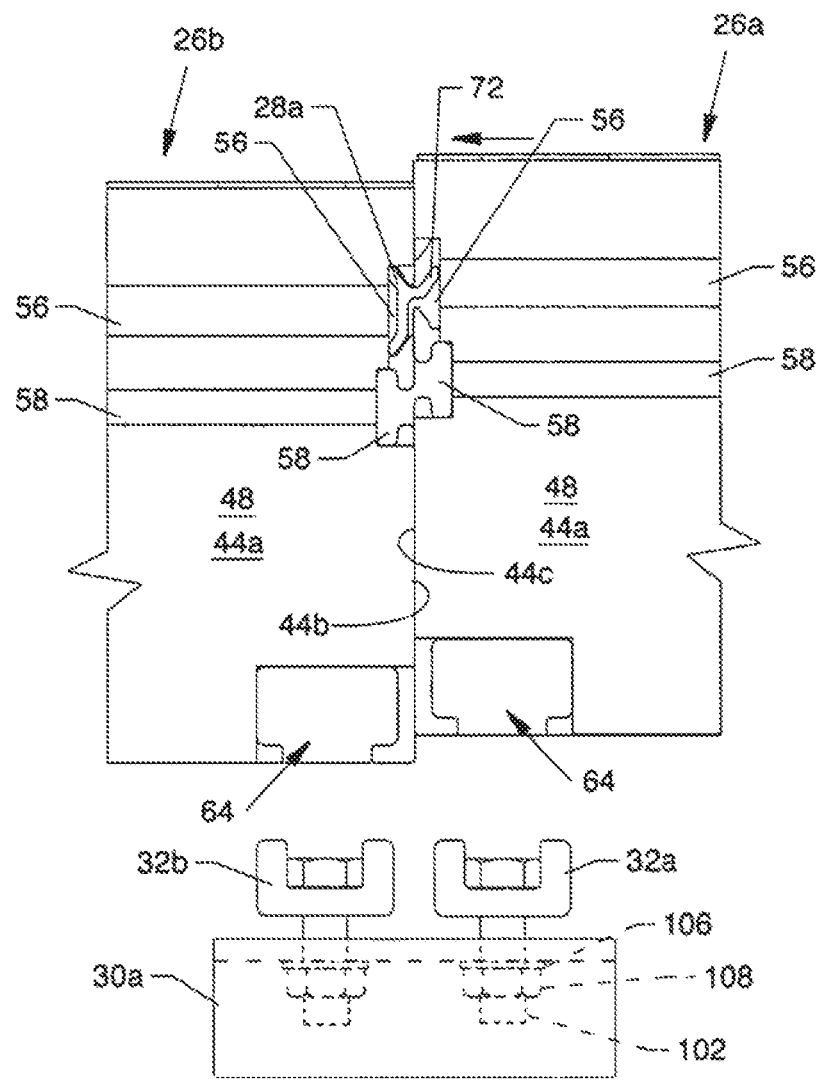
FIG. 11 is a top view showing a step where a slotted frame cabinet and a horizontally adjacent slotted frame cabinet are urged into offset intimate contact, whereby a panel of a splice bar enters into a splice bar slot in a slotted frame end of a horizontally adjacent slotted frame cabinet.

FIG. 11 is a top view showing a step where the slotted frame cabinet 26a and the slotted frame cabinet 26b are urged into offset intimate contact, whereby the panel 72 of the splice bar 28a enters into the splice bar slot 56 in the slotted frame end 44c of the slotted frame cabinet 26a.

Figure 12:
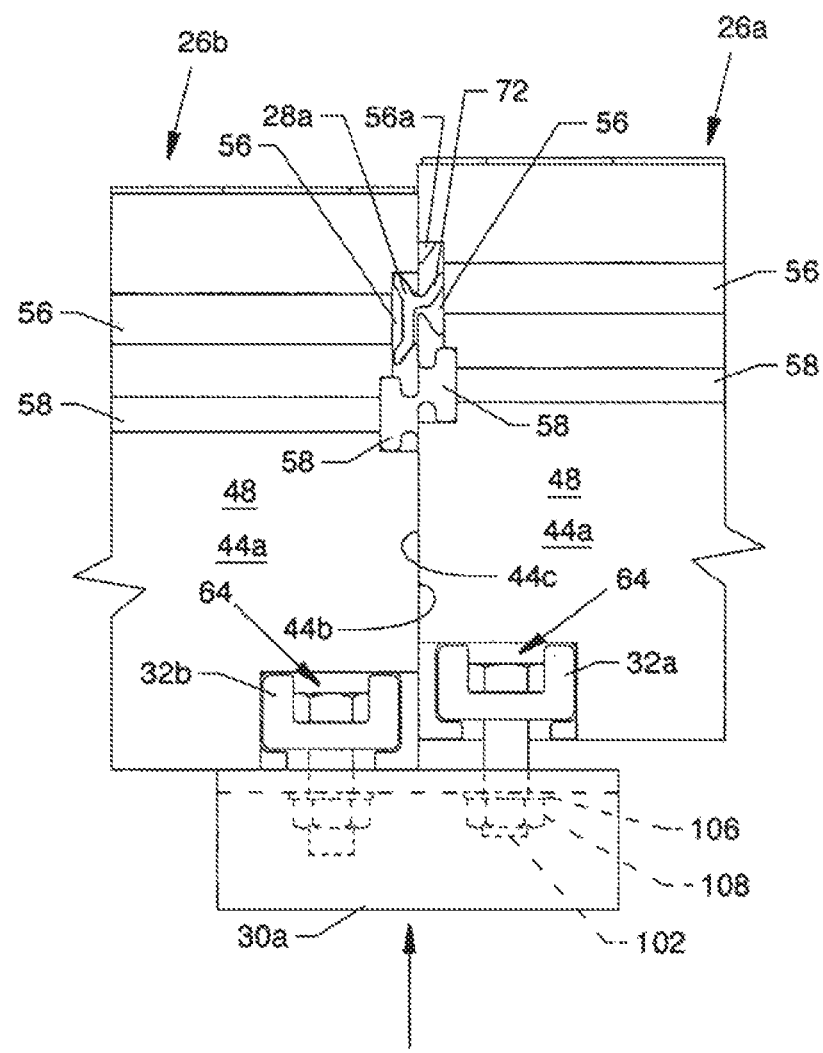
FIG. 12 is a top view showing a step where the vertically oriented backing bars in an assembly of the backing bars, splice plate bolts, washers and nuts are loaded in offset fashion into the vertically aligned rearwardly located backing bar slots.

FIG. 12 is a top view showing a step where the vertically oriented backing bars 32a and 32b, in an assembly with the splice plate 30a, bolts 102, washers 106, and nuts 108, can be loaded in an offset fashion into the vertically aligned rearwardly located backing bar slot 64 extending along the slotted frame end 44c of the slotted frame cabinet 26a and vertically aligned backing bar slot 64 extending along the slotted frame end 44b of the slotted frame cabinet 26b, respectively.

Figure 13:
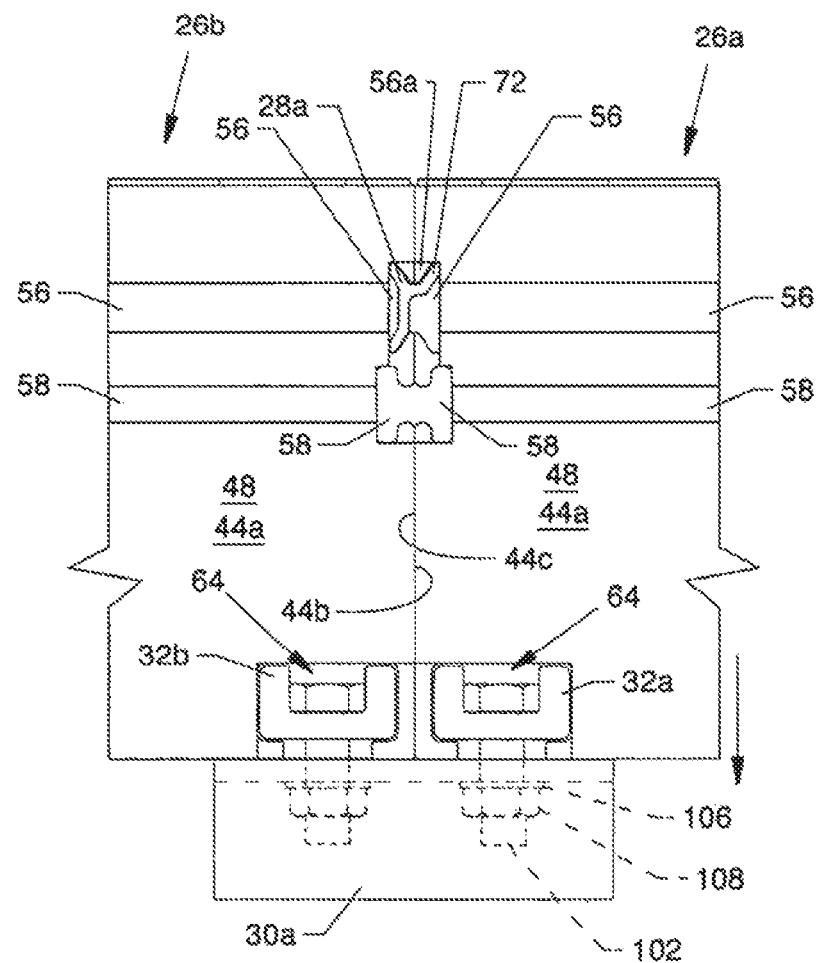
FIG. 13 is a top view showing a step where one or more nuts are tightened in order that a slotted frame cabinet is forcibly drawn into intimate and forced contact with the splice plate.

FIG. 13 is a top view showing a step where one or more nuts 108 are tightened in order that the slotted frame cabinet 26a is forcibly drawn into intimate contact with the splice plate 30a. The slotted frame cabinet 26b is shown in intimate contact with and secured to the splice plate 30a by the use of the backing bar 32b which is located in the backing bar slot 64 in the slotted frame end 44b of the slotted frame cabinet 26b. Force is applied by tightening nuts 108 to cause frictional engagement between the backing bars 32a, 32b, the slots 64 in which they are aligned, the nuts 108, the washers 106, and the splice plate 30a. In this example and during such forcible engagement, the slotted frame cabinet 26a is positioned rearwardly against the splice plate 30a to cause the forwardly located angled slot wall 56a (also shown in FIG. 4) of the slotted frame end 44c in the slotted frame cabinet 26a to intimately and lockingly contact the panel 72 of the splice bar 28a. Thus, securing of a slotted frame cabinet (26a) to a horizontally adjacent slotted frame cabinet (26b) is accomplished by use of a splice plate (28a) and associated backing bars (32a and 32b) at a rearward location and by the use of a splice bar (2Sa) at a forward location. In the alternative, the backing bars 32a and 32b, washers 100, and bolts 108 can be loaded into the backing bar slots 64 and the splice plate 30a and associated hardware can be installed and secured, as indicated in different stages in FIG. 14, to draw the slotted frame cabinet 26a and the slotted frame cabinet 26b together in a suitable manner. Such actions also align the fronts of the slotted frame cabinet 26a and the slotted frame cabinet 26b and the backs of the slotted frame cabinet 26a and slotted frame cabinet 26b.

The capture of the splice bar 28*a* between the slotted frame end 44*c* of the slotted frame cabinet 26*a* and the slotted frame end 44*b* of the slotted frame cabinet 26*b* provides for vertical connection, in part, of the slotted frame cabinets 26*a* and 26*b*. Vertical connection between the slotted frame end 44*c* of the slotted frame cabinet 26*a* and the slotted frame end 44*b* of the slotted frame cabinet 26*b* is completed by the use of the splice plate 30*a*, the steps of which have just been described.

Figure 14:
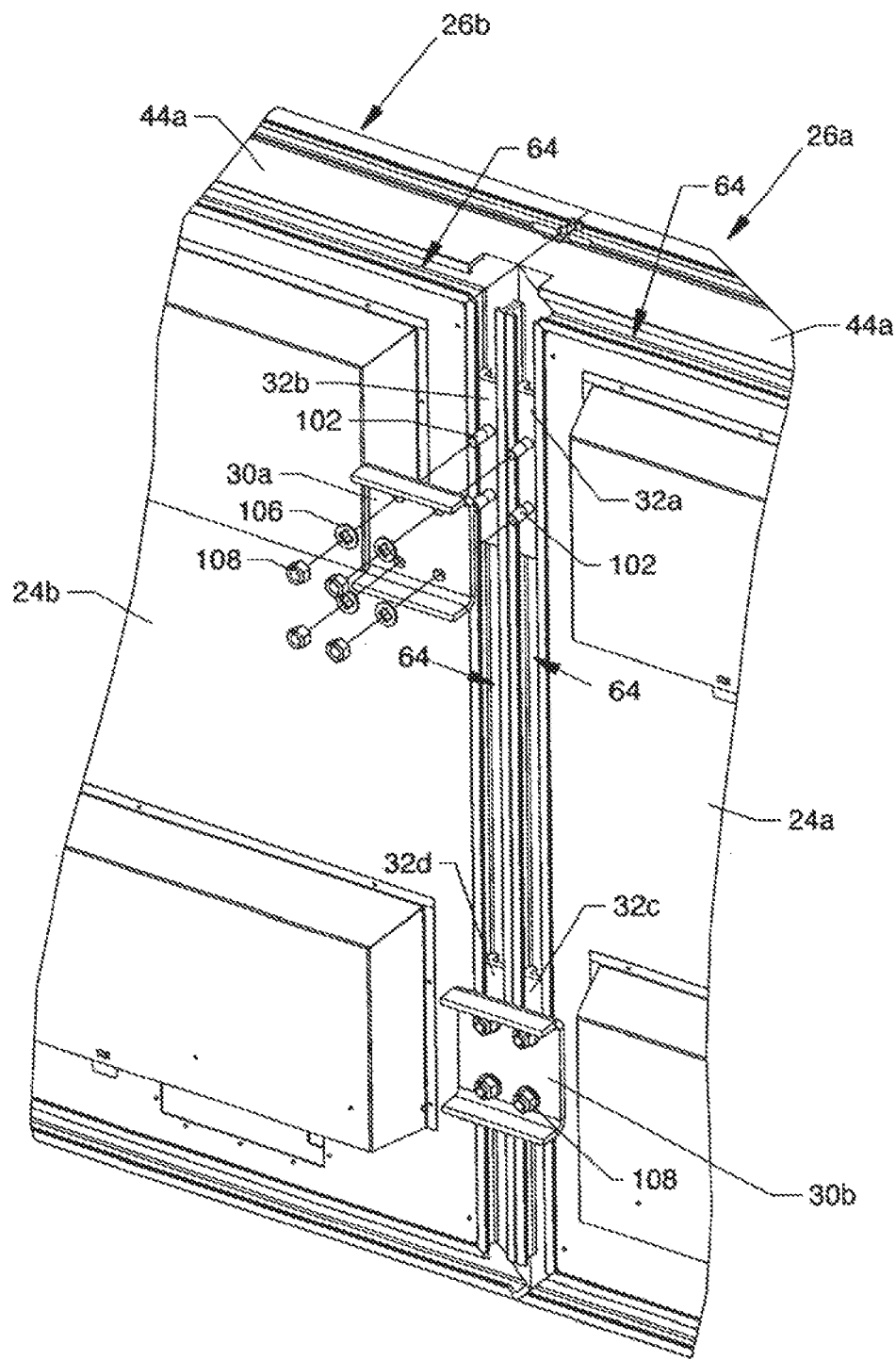
FIG. 14 shows the use of multiple splice plates, backing bars, and associated components to, in part, suitably connect horizontally adjacent slotted frame cabinets.

FIG. 14 shows the use of multiple splice plates 30*a* and 30*b*, backing bars 32*a*-32*d*, and associated components to, in part, suitably connect horizontally adjacent slotted frame cabinets 26*a* and 26*b*, as previously described. Horizontally adjacent slotted frame cabinets 26*c* and 26*n* are connected using like components in the same manner as previously described for connection of horizontally adjacent slotted frame cabinets 26*a* and 26*b*. Other horizontally adjacent slotted frame cabinets 26 can be attached using the above described methods in order to provide a longer electronic sign.

Figure 15:
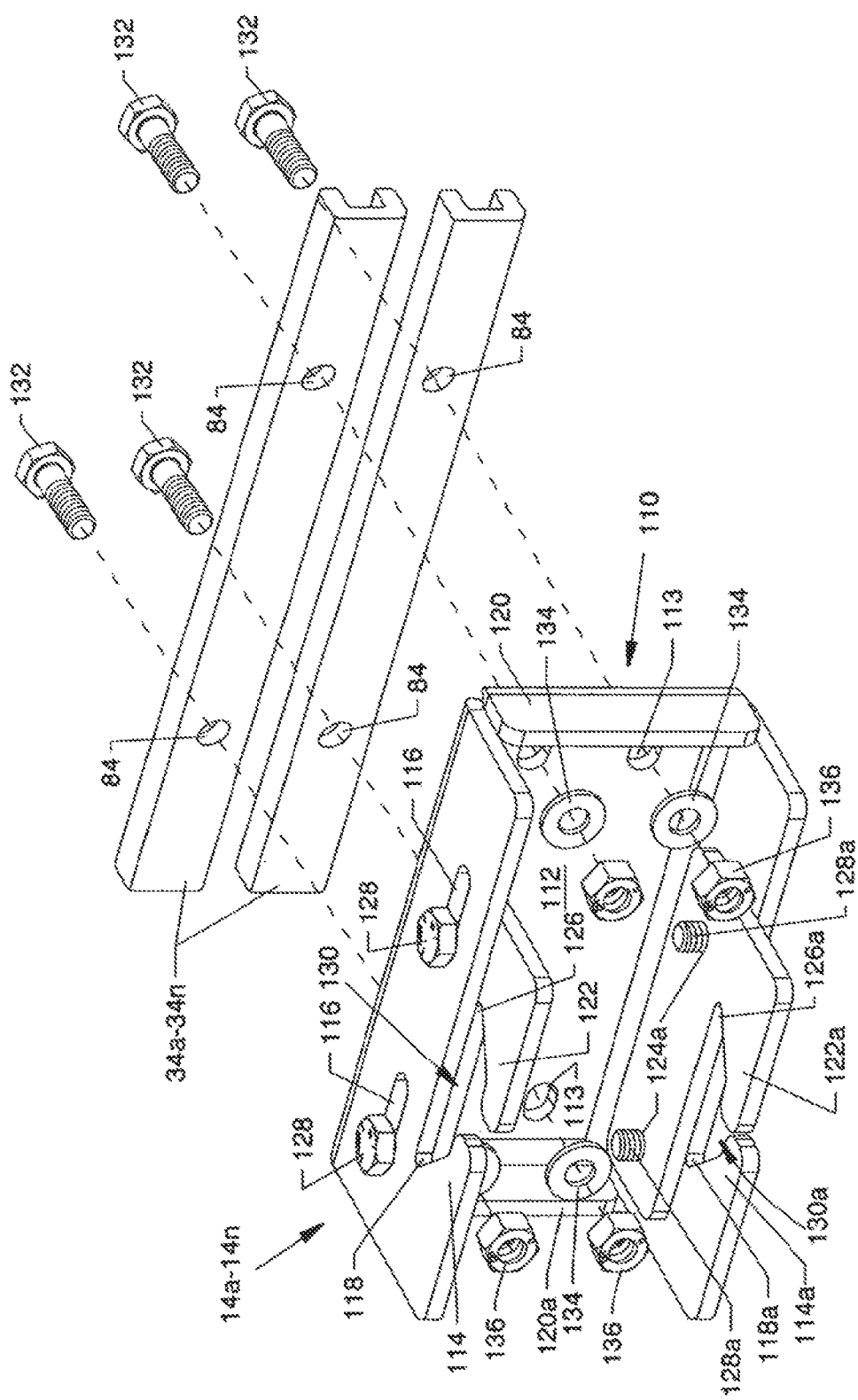
FIG. 15 is an isometric view of one of the mounting clamps and two of the backing bars used with the mounting clamps and associated hardware to, in part, secure horizontally adjacent slotted frame cabinets.
Figure 16:
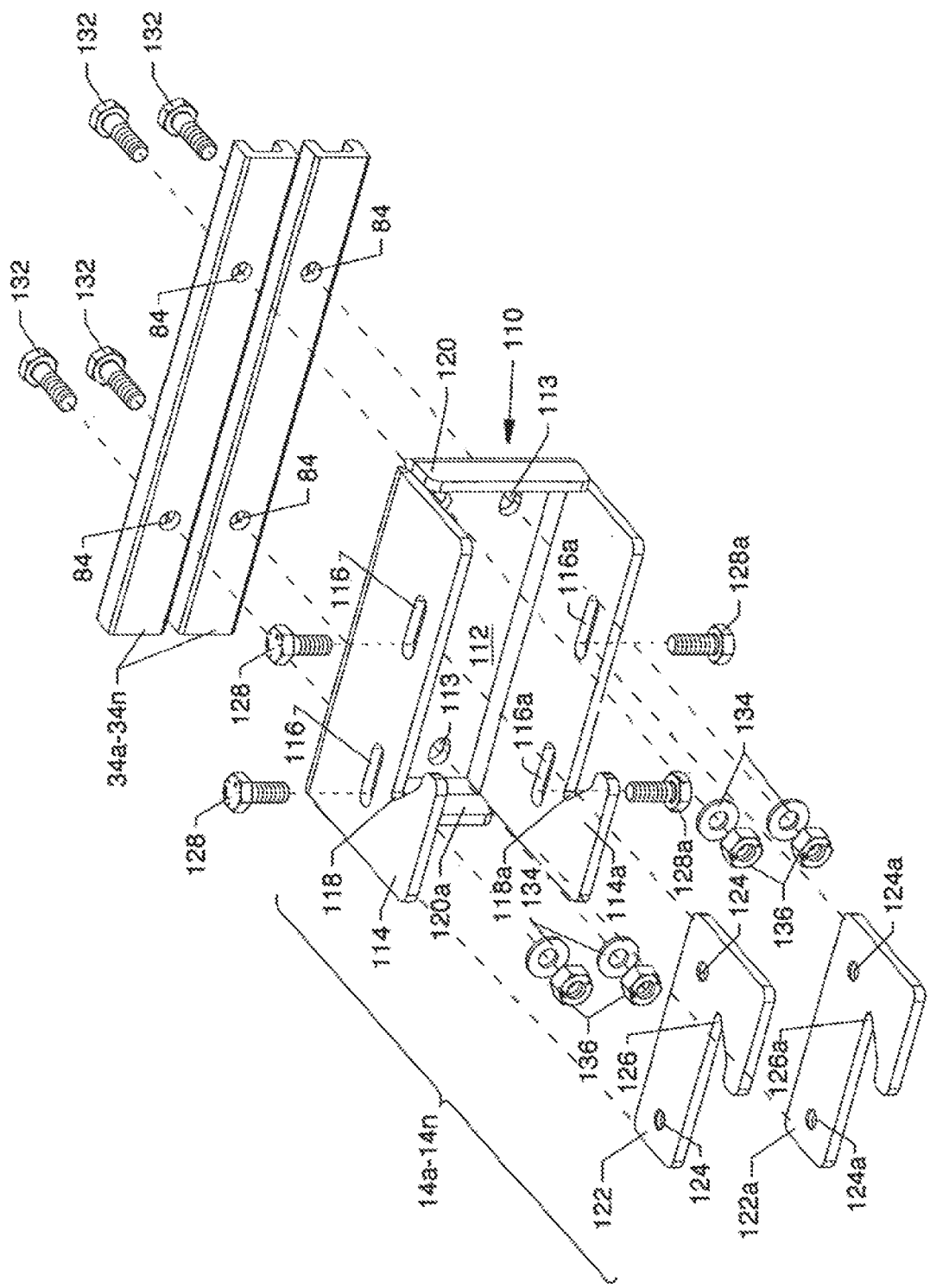
FIG. 16 is an exploded view of the components of FIG. 15.

FIG. 15 is an isometric view of one of the mounting clamps 14*a*-14*n* and two of the backing bars 34*a*-34*n* used with the mounting clamps 14*a*-14*n* and associated hardware to, in part, secure vertically adjacent slotted frame cabinets such as slotted frame cabinets 26*a* and 26*c*. FIG. 16 is an exploded view of the components of FIG. 15. The mounting clamps 14*a*-14*n* include a stationary bracket 110 having a rear panel 112 with holes 113 therein, a top jaw panel 114 having elongated slots 116 therein, and a V-shaped capture jaw slot 118, a bottom jaw panel 114*a* opposing the top jaw panel 114 having elongated slots 116*a* therein and a V-shaped capture jaw slot 118*a*, and opposed side panels 120 and 120*a*. The mounting clamps 14*a*-14*n* also include a positionable top jaw panel 122 having threaded holes 124 therein and a V-shaped capture jaw slot 126, a positionable bottom jaw panel 122*a* opposing the positionable top jaw panel 122 with threaded holes 124*a* therein and a V-shaped capture jaw slot 126*a*. The positionable top jaw panel 122 is aligned with and positionable along the bottom of the top jaw panel 114 of the stationary bracket 110 and is secured thereto by bolts 128 extending through the elongated slots 116 and into the threaded holes 124 of the top jaw panel 122 to provide a variable width lockable opening 130 between the V-shaped capture jaw slot 118 of the stationary bracket 110 and the V-shaped capture jaw slot 126. In a like manner, the positionable bottom jaw panel 122*a* is aligned to and positionable along the top of the bottom jaw panel 114*a* of the stationary bracket 110 and is secured thereto by bolts 128*a* extending through the elongated slots 116*a* and into the threaded holes 124*a* of the bottom jaw panel 122*a* to provide a variable width lockable opening 130*a* between the V-shaped capture jaw slot 118*a* of the stationary bracket 110 and the V-shaped capture jaw slot 126*a*. Backing bars 34*a*-34*n* are located in one or more horizontally oriented backing bar slots 64 and are attached to mounting clamps 14*a*-14*n* and by using some or all of the bolts 132 which extend through some or all of holes 84 of the backing bars 34*a*-34*n*, respectively, through the openings in the backing bar slots 64, through holes 113 in the stationary bracket 110 and into washers 134 and nuts 136.

Figure 17:
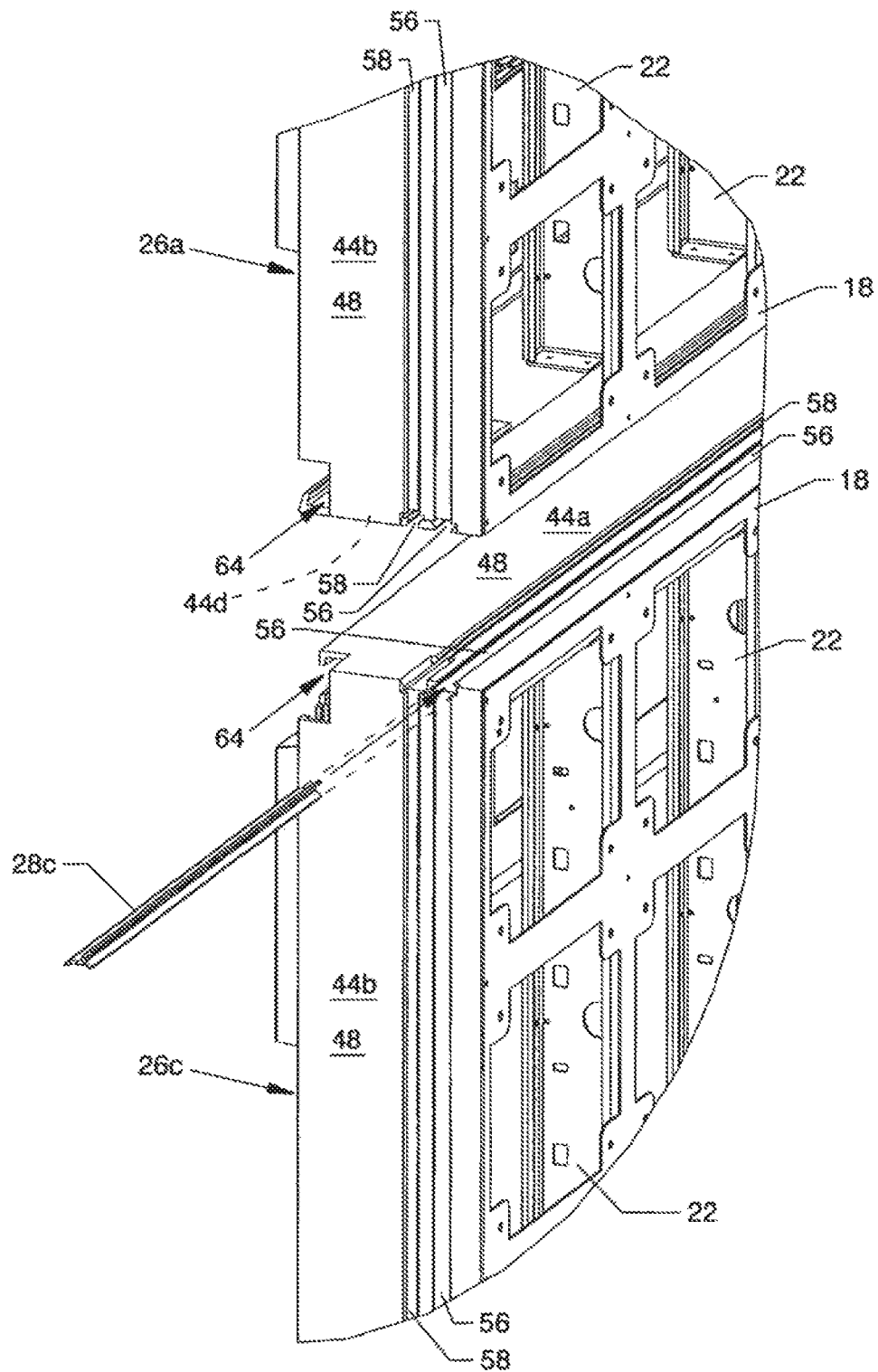
FIG. 17 shows the initial alignment of a slotted frame top of a lower slotted frame cabinet in close proximity to a slotted frame bottom of an upper slotted frame cabinet.
Figure 18:
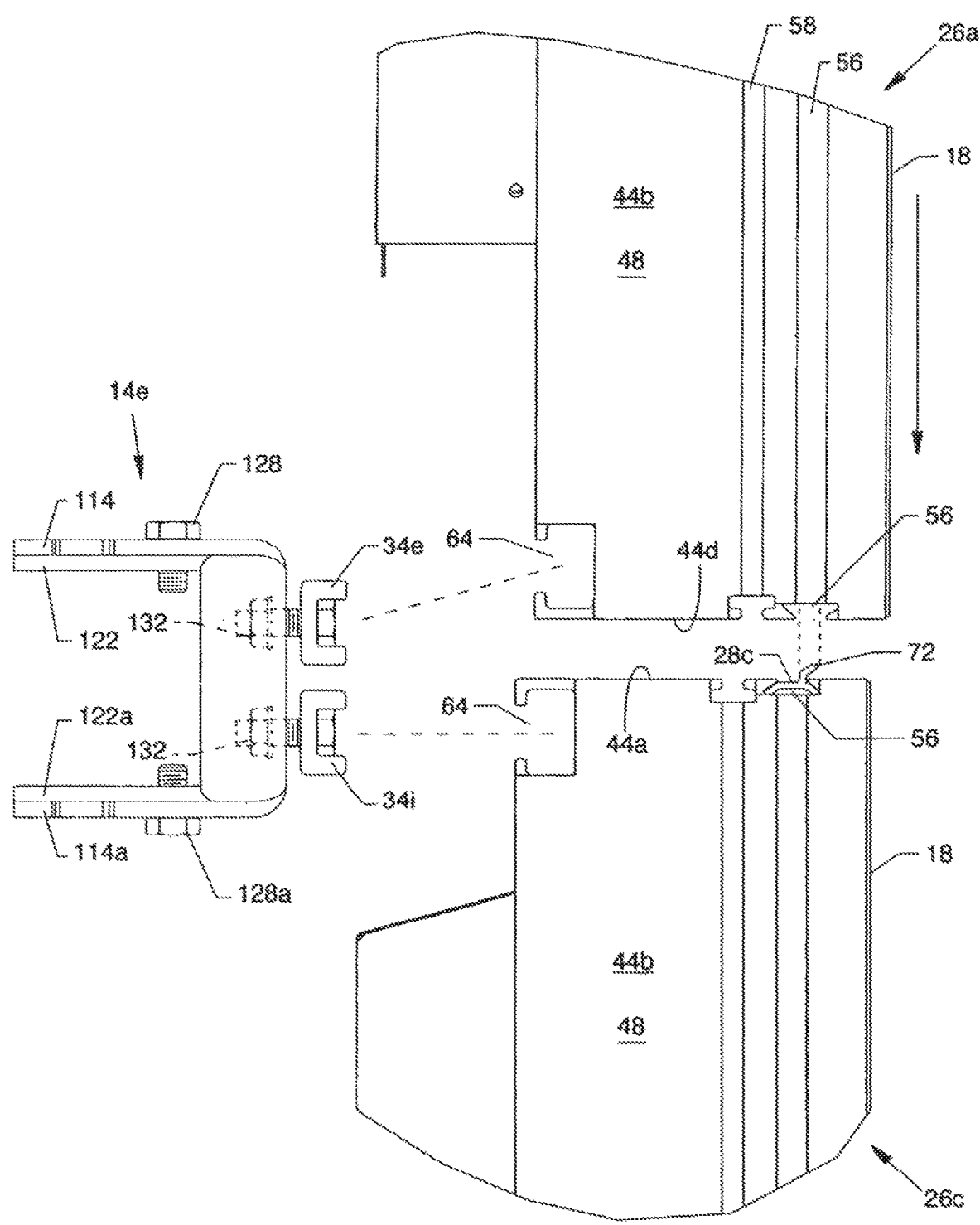
FIG. 18 is an end view showing a step where a horizontally aligned splice bar is aligned in the splice bar slot in the slotted frame top of a slotted frame cabinet.

FIG. 17 shows the initial alignment of the slotted frame top 44*a* of a lower slotted frame cabinet 26*c* in close proximity to the slotted frame bottom 44*d* of an upper slotted frame cabinet 26*a*. A portion of a horizontally aligned splice bar 28*c* is shown distanced but aligned with the splice bar slot 56 of the slotted frame top 44*a* in the slotted frame cabinet 26*c* awaiting positioning therein. Preferably, the slotted frame cabinet 26*a* and the slotted frame cabinet 26*c* are offset from each other, as shown in FIG. 18. The display modules 16 are not shown for the purpose of brevity and clarity.

FIG. 18 is an end view showing a step where the horizontally aligned splice bar 28*c* is aligned in the splice bar slot 56 in the slotted frame top 44*a* of the slotted frame cabinet 26*c*. The slotted frame cabinet 26*c* and the slotted frame cabinet 26*a* are offset from each other in order that the panel 72 of the horizontally aligned splice bar 28*c* aligns with the opening of the splice bar slot 56 in the slotted frame bottom 44*d* of the slotted frame cabinet 26*a*. An end view of two of the backing bars 34*e* and 34*i*, including an associated mounting clamp 14*e*, is shown awaiting engagement with the backing bar slot 64 located along the bottom of the slotted frame cabinet 26*a* and with the backing bar slot 64 located along the top of the slotted frame cabinet 26*c*.

Figure 19:
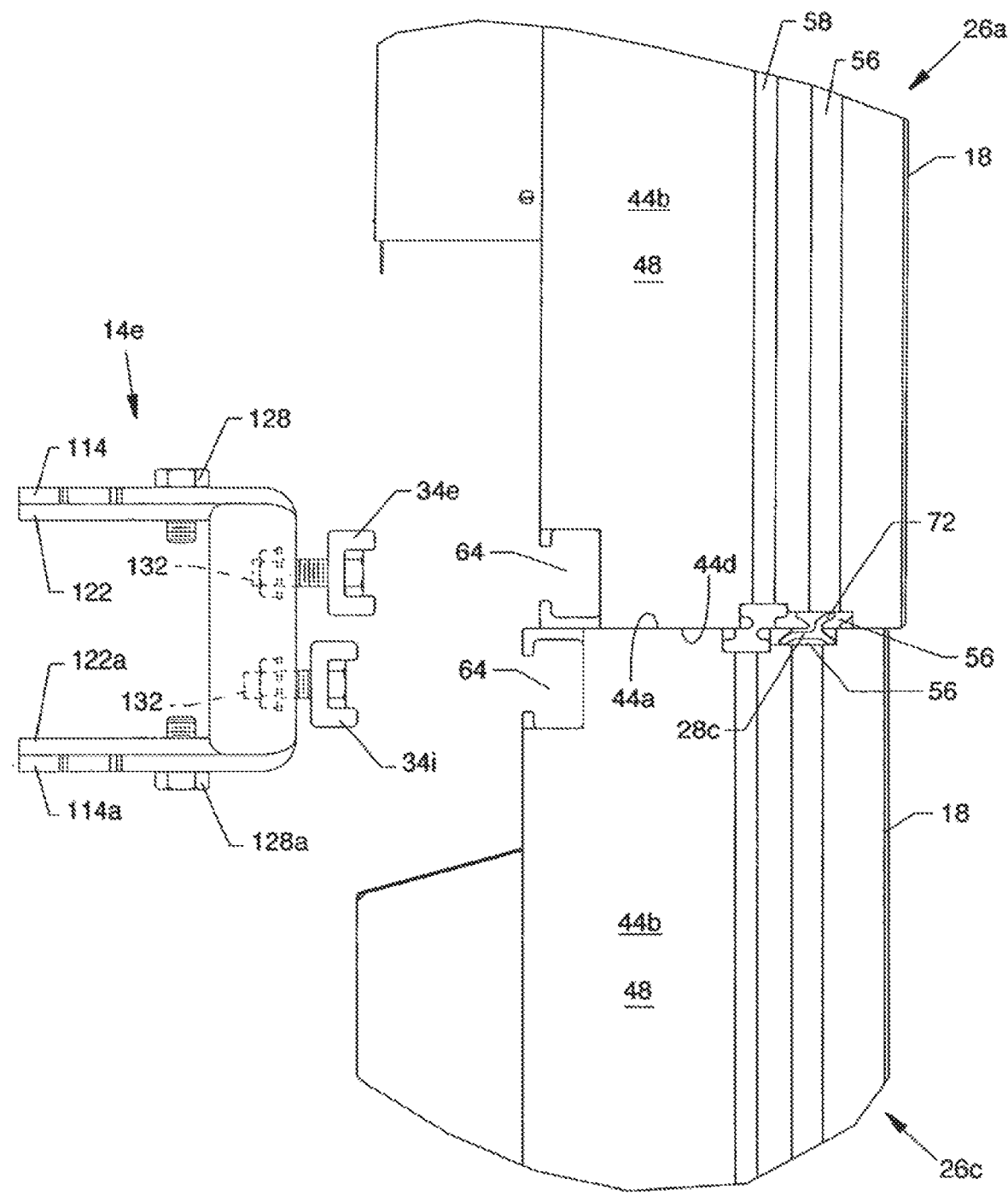
FIG. 19 is an end view showing a step where an upper slotted frame cabinet and a lower slotted frame cabinet are manually urged into offset intimate contact.

FIG. 19 is an end view showing a step where the slotted frame cabinet 26*a* and the slotted frame cabinet 26*c* are manually urged into offset intimate contact, whereby the panel 72 of the splice bar 28*c* enters into the splice bar slot 56 in the slotted frame bottom 44*d* of the slotted frame cabinet 26*a*.

Figure 20:
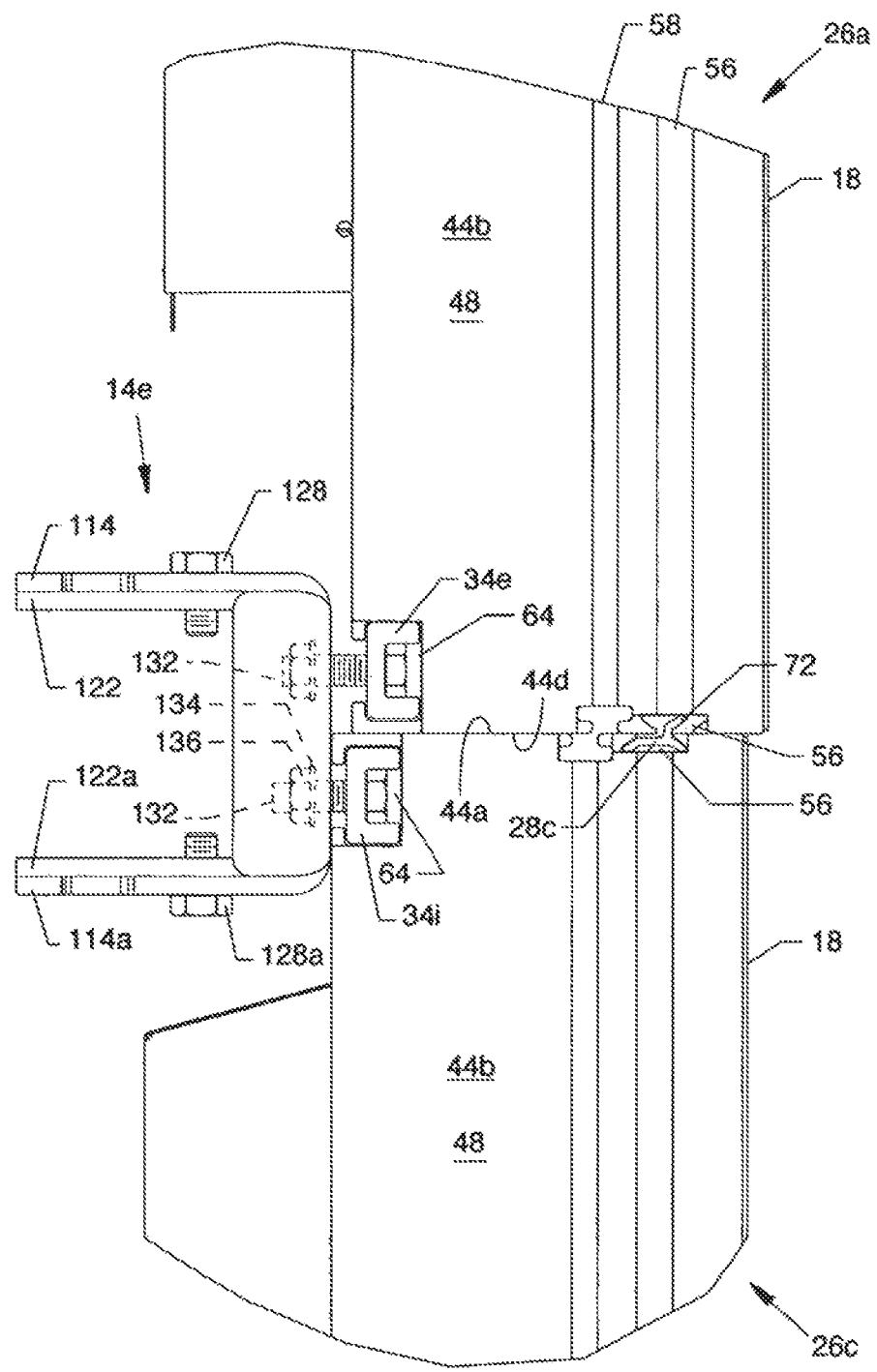
FIG. 20 is an end view showing a step where the horizontally oriented backing bars in an assembly consisting of the backing bars, a mounting clamp, bolts, washers, and nuts are loaded in an offset fashion into horizontally adjacent and aligned backing bar slots.

FIG. 20 is an end view showing a step where the horizontally oriented backing bars 34*e* and 34*i* are in an assembly consisting of the backing bars 34*e* and 34*i*, a mounting clamp 14*e*, bolts 132, washers 134, and nuts 136 and are loaded, in an offset manner, into the horizontally aligned backing bar slots 64 extending along the slotted frame bottom 44*d* of the slotted frame cabinet 26*a* and horizontally aligned backing bar slot 64 along the slotted frame top 44*a* of the slotted frame cabinet 26*c*, respectively.

Figure 21:
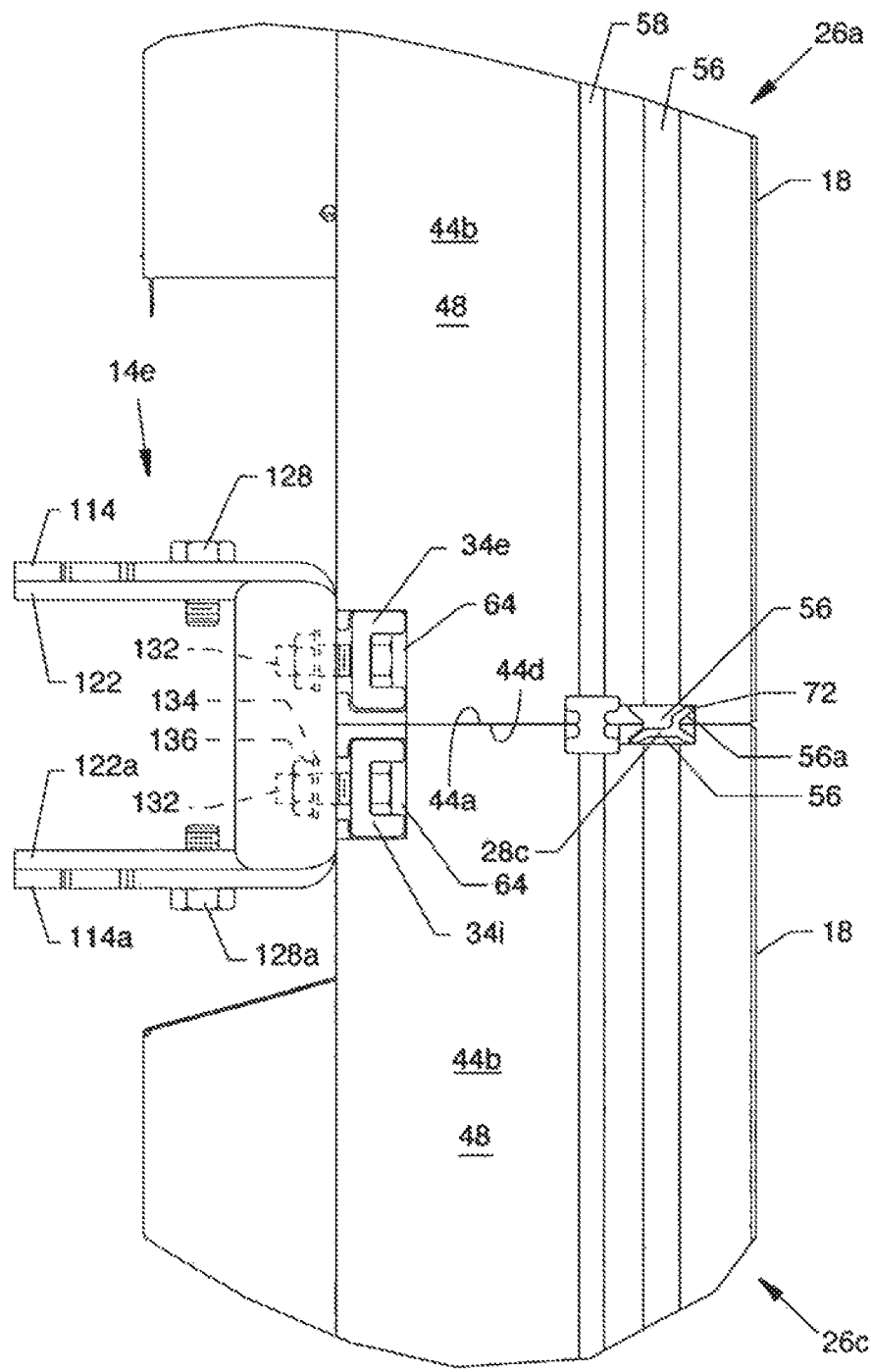
FIG. 21 is an end view showing a step where one or more nuts are tightened in order that a slotted frame cabinet is forcibly drawn into intimate and forced contact with a mounting clamp.
Figure 22:
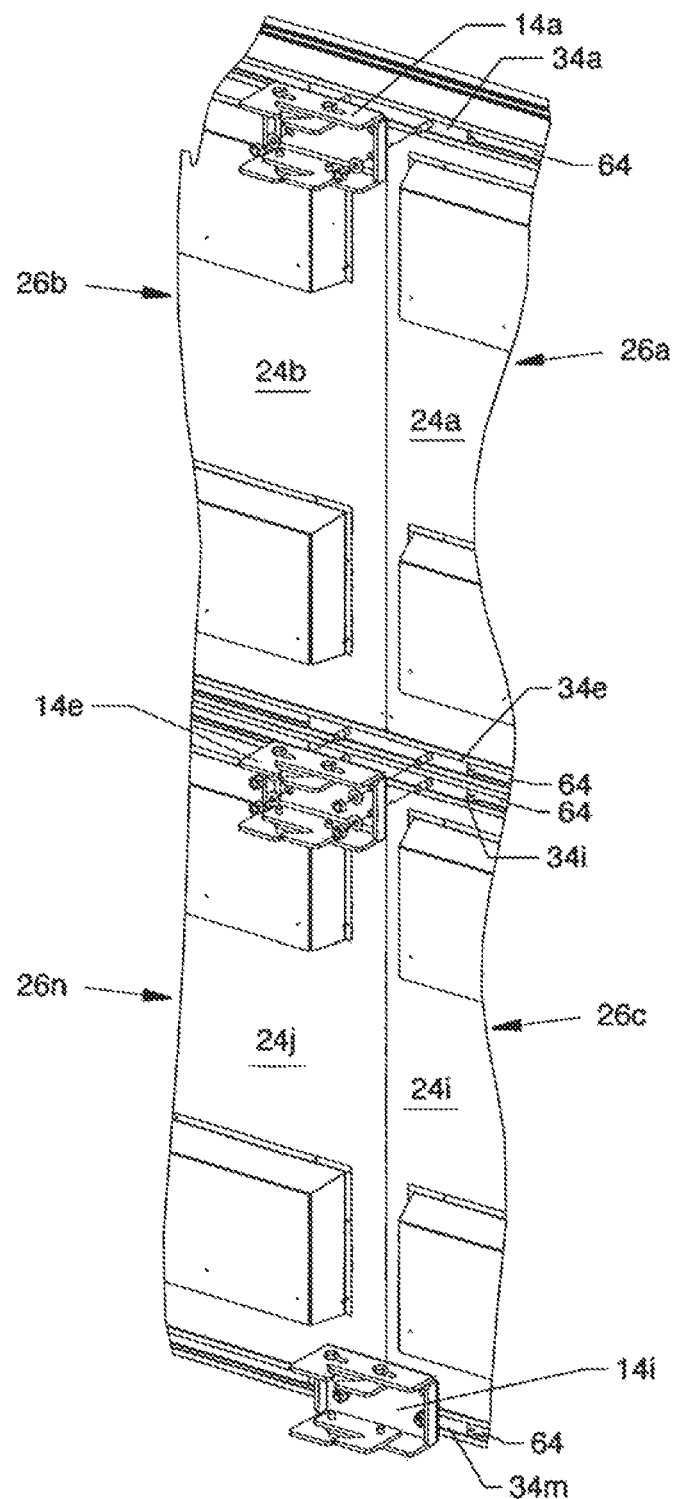
FIG. 22 shows the use of multiple mounting clamps, backing bars, and associated components to, in part, suitably connect horizontally adjacent slotted frame cabinets.

FIG. 21 is an end view showing a step where one or more nuts 136 are tightened in order that the slotted frame cabinet 26*a* is forcibly drawn into intimate contact with one or more of the mounting clamps 14*a*-14*n*, such as mounting clamp 14*e*. The slotted frame cabinet 26*c* is shown in intimate contact with and secured to the mounting clamp 14*e* by the use of the backing bar 34*i* which is located in the backing bar slot 64 in the slotted frame top 44*a* of the slotted frame cabinet 26*c*. Force is applied to cause frictional engagement across the backing bars 34*e*, 34*i* and the slots 64 in which they are aligned, the nuts 136, the washers 134, and the mounting clamp 14*e*. In this example and during such forcible engagement, the slotted frame cabinet 26*a* is positioned rearwardly against the mounting clamp 14*e* to cause the forwardly located angled slot wall 56*a* (also shown in FIG. 4) of the slotted frame bottom 44*d* in slotted frame cabinet 26*a* to intimately and lockingly contact the panel 72 of the splice bar 28*c*. Thus, securing of an upper slotted frame cabinet (26*a*) to a lower slotted frame cabinet (26*c*) is accomplished by use of a mounting clamp (14*e*) and associated backing bars (34*e* and 34*i*) at a rearward location and by the use of a splice bar (28*c*) at a forward location. In the alternative, the backing bars 34*e* and 34*i* and bolts 132 can be loaded into the backing bar slots 64 and the mounting clamp 14*e* and associated hardware can be installed and secured as indicated in FIG. 22 to draw the slotted frame cabinet 26*a* and the slotted frame cabinet 26*c* together in a suitable manner. Such actions also align the fronts and the backs of the slotted frame cabinet 26*a* and the slotted frame cabinet 26*c*.

The capture of the splice bar 28*c* between the slotted frame end 44*d* of the slotted frame cabinet 26*a* and the slotted frame end 44*a* of the slotted frame cabinet 26*c* provides for horizontal connection, in part, of the slotted frame cabinets 26*a* and 26*c*. Horizontal connection between the slotted frame end 44a of the slotted frame cabinet 26a and the slotted frame end 44d of the slotted frame cabinet 26c is completed by the use of the mounting clamp 14e the steps of which have just been described.

FIG. 22 shows the use of multiple mounting clamps 14a, 14e, 14i, backing bars 34a, 34e, 34i, and associated components to, in part, suitably connect vertically adjacent slotted frame cabinets 26a and 26c, as previously described. Vertically adjacent slotted frame cabinets 26b and 26n are connected using like components in the same manner as previously described for connecting vertically adjacent slotted frame cabinets 26a and 26c. Other vertically adjacent slotted frame cabinets 26 can be attached using the above described methods in order to provide a taller electronic sign. The mounting clamps 14a-14n are horizontally positionable within the horizontally oriented backing bars 64, respectively, in order to align with the support structures such as support structures 12a-12n (shown in FIG. 1).

Figure 23:
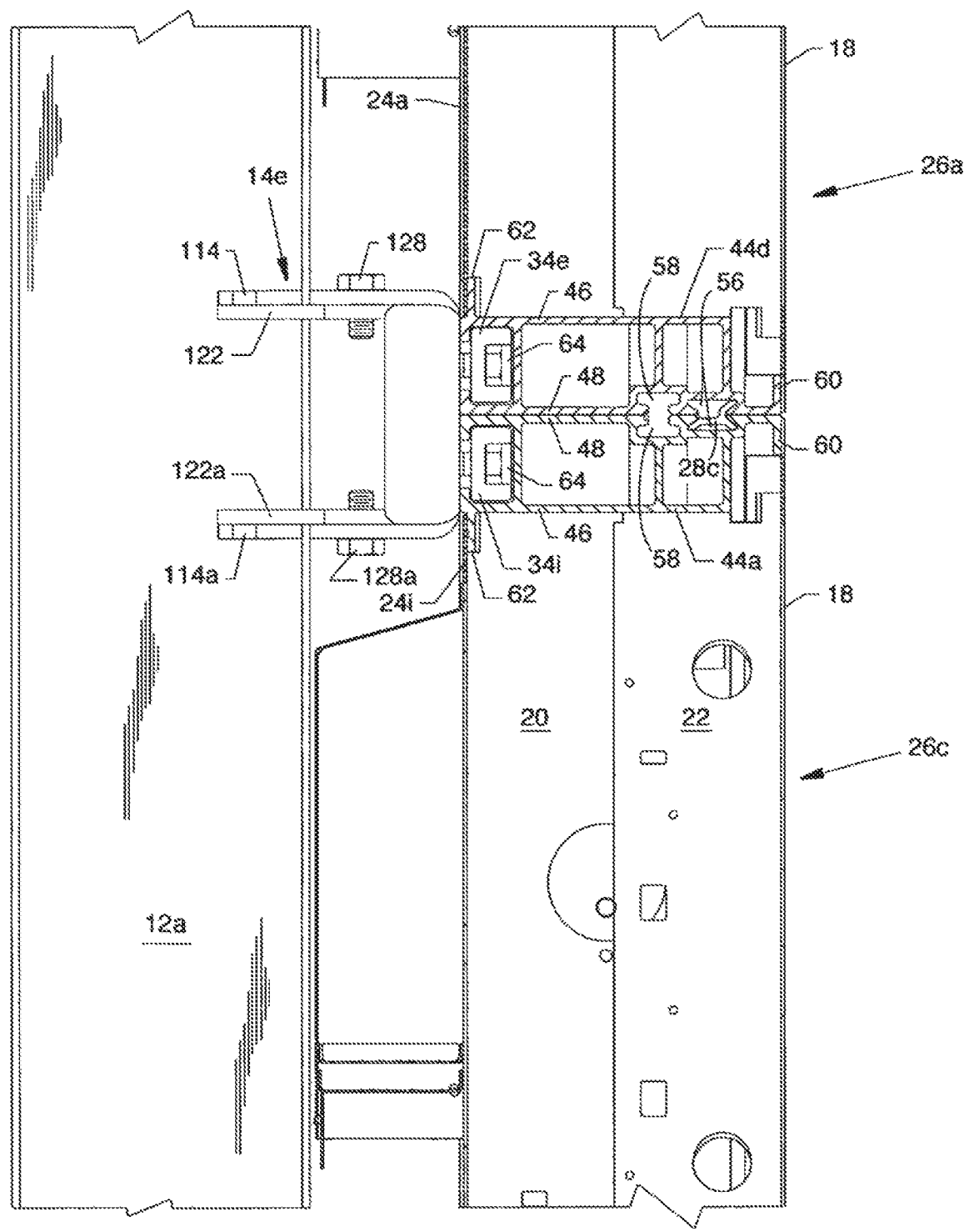
FIG. 23 is a cross section view showing a mounting clamp in use with splice bars to, in part, secure an upper slotted frame cabinet to a lower slotted frame cabinet, as well as showing the use of a mounting clamp to, in part, connect an upper slotted frame cabinet and lower slotted frame cabinet to a support structure; and, FIG. 24 is a top view showing the use of a mounting clamp to fasten a slotted frame cabinet to a vertically aligned support structure.

FIG. 23 is a cross section view showing mounting clamp 14e in use along with the splice bar 28c to, in part, secure an upper slotted frame cabinet 26a to a lower slotted frame cabinet 26c using backing bars 34e and 34i. A single backing bar 34a or a single backing bar 34m, such as shown in FIG. 22, can be used at the tops or bottoms of slotted frame cabinets 26a-26n for fastening some of the mounting clamps 14a-14n to the slotted frame cabinets 26a-26n. Mounting clamp 14e is used to connect the upper slotted frame cabinet 26a and adjoining lower slotted frame cabinet 26c to a support structure 12a, as shown in FIGS. 23 and 23.

Figure 24:
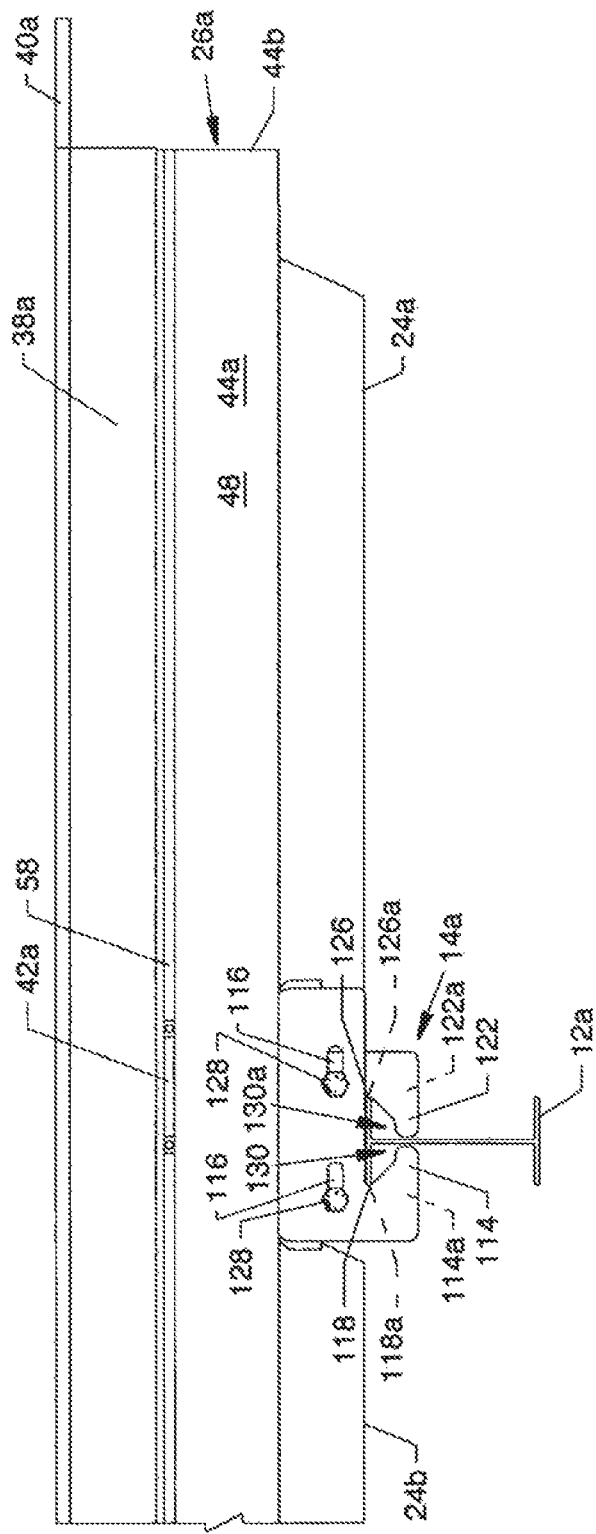

FIG. 24 is a top view showing the use of a mounting clamp 14a to fasten a slotted frame cabinet 26a to a vertically aligned support structure 12a. The bolts 128 and 128a can be loosened to allow the positionable top jaw panel 122 and the positionable bottom jaw panel 122a to be horizontally distanced from the top jaw panel 114 and the bottom jaw panel 114a in order to capture the vertical edges of one end of the support structure 12a. The electronic sign having slotted frame cabinets 10 can be maneuvered horizontally into contact with one or more of the support structures 12a-12n. Subsequently, the top jaw panel 122 and the bottom jaw panel 122a are positioned toward the top jaw panel 114 and the bottom jaw panel 114a in order to capture the inwardly located edges of the support structure 12a within the variable width lockable openings 130 and 130a, respectively, and more specifically, to capture the support structure 12a by intimate forced contact with the capture jaw slots 118, 118a, 126, 126a, respectively.

Various modifications can be made to the present invention without departing from the apparent scope thereof.

What is claimed is:

1. An electronic display comprising:
    one or more cabinets, each cabinet including a front side and a rear side;
    a mounting slot disposed on the rear side of at least one cabinet; and
    one or more mounting clamps positionable along, and couplable to, the mounting slot, wherein the one or more mounting clamps are configured to secure the one or more cabinets to a ground mounted or suspended support structure without structurally penetrating the one or more cabinets.

2. An electronic display mounting system comprising:
    a cabinet including a front side and a rear side;
    a mounting slot provided on the rear side of the cabinet;
    one or more backing members configured to engage with the mounting slot; and
    one or more mounting clamps configured to be coupled to the one or more backing members and positionable along the mounting slot, wherein the one or more mounting clamps are configured to secure the cabinet to a support structure without structurally penetrating the cabinet.

3. The electronic display mounting system of claim 2, wherein the support structure comprises a ground mounted or suspended support structure.

4. The electronic display mounting system of claim 2, wherein the mounting slot defines a channel.

5. The electronic display mounting system of claim 4, wherein the one or more backing members are configured to slide within the channel along a first direction and inhibit being pulled from the channel in a second direction.

6. The electronic display mounting system of claim 5, wherein the second direction is substantially perpendicular to the first direction.

7. The electronic display mounting system of claim 2, wherein the one or more backing members comprise backing bars.

8. The electronic display mounting system of claim 2, wherein each of the one or more mounting clamps includes one or more jaw members.

9. The electronic display mounting system of claim 2, wherein the one or more mounting clamps include a portion configured to overlap at least a portion of a support structure and couple thereto.

10. An electronic display mounting system comprising:
    a display cabinet;
    a mounting slot disposed on a rear side of the display cabinet, the mounting slot defining a channel;
    a backing bar positionable within the channel and configured to slide within the channel along a first direction; and
    a mounting clamp coup able to the backing bar and positionable along the mounting slot, wherein the mounting clamp is configured to secure the display cabinet to a support structure;
    wherein the mounting clamp is configured to secure the display cabinet to the support structure without structurally penetrating the display cabinet.

11. The electronic display mounting system of claim 10, wherein the backing bar is sized and structured to inhibit being pulled from the channel in a second direction that is different than the first direction.

12. The electronic display mounting system of claim 11, wherein the second direction is substantially perpendicular to the first direction.

13. The electronic display mounting system of claim 10, wherein the support structure comprises a ground mounted or suspended support structure.

14. The electronic display mounting system of claim 10, further comprising a display module configured to be secured to the display cabinet.

15. The electronic display mounting system of claim 10, wherein the mounting clamp includes a portion configured to overlap at least a portion of a support structure and couple thereto.

16. The electronic display mounting system of claim 15, wherein the support structure is an I-beam.

17. The electronic display mounting system of claim 10, wherein the mounting clamp includes a movable jaw member.

18. The electronic display mounting system of claim 17, wherein the mounting clamp further includes a stationary jaw member.

19. The electronic display mounting system of claim 10, comprising a plurality of backing bars and a plurality of mounting clamps.

\* \* \* \* \*